(12) United States Patent
Smith et al.

(10) Patent No.: US 12,386,271 B2
(45) Date of Patent: Aug. 12, 2025

(54) MULTI-LAYER CALIBRATION FOR EMPIRICAL OVERLAY MEASUREMENT

(71) Applicant: Onto Innovation Inc., Wilmington, MA (US)

(72) Inventors: Nigel P. Smith, Beaverton, OR (US); Francis Scott Hoover, Houston, TX (US); Nicholas James Keller, La Jolla, CA (US); Kevin Eduard Heidrich, Beaverton, OR (US)

(73) Assignee: Onto Innovation Inc., Wilmington, MA (US)

( * ) Notice: Subject to any disclaimer, the term of this patent is extended or adjusted under 35 U.S.C. 154(b) by 683 days.

(21) Appl. No.: 17/707,776

(22) Filed: Mar. 29, 2022

(65) Prior Publication Data

US 2022/0326626 A1 Oct. 13, 2022

Related U.S. Application Data

(60) Provisional application No. 63/168,181, filed on Mar. 30, 2021.

(51) Int. Cl.
*G03F 7/20* (2006.01)
*G01B 11/27* (2006.01)
(Continued)

(52) U.S. Cl.
CPC .......... *G03F 7/70633* (2013.01); *G01B 11/27* (2013.01); *G03F 1/70* (2013.01)

(58) Field of Classification Search
CPC ....... G03F 7/70653; G03F 1/70; G01B 11/27; G01B 11/275; G01B 11/28
See application file for complete search history.

(56) References Cited

U.S. PATENT DOCUMENTS 9,007,584 B2 4/2015 Li
2003/0169423 A1* 9/2003 Finarov ............... G03F 7/70633
356/401
(Continued)

FOREIGN PATENT DOCUMENTS

TW 201925910 A 7/2019
WO 2014159787 A1 10/2014

OTHER PUBLICATIONS

Feng, Yaobin, "Fast in-device overlay metrology on multi-tier 3DNAND devices without DECAP and it's applications in 1 process characterization and control," SPIEDigitalLibrary.org/conference-proceedings-of-spie, Mar. 7, 2021.
(Continued)

*Primary Examiner* — Michelle M Iacoletti
*Assistant Examiner* — Clark David Hovis
(74) *Attorney, Agent, or Firm* — Paradice & Li LLP

(57) ABSTRACT

Overlay is determined for a device using signals measured from the device and a signal response to overlay determined from a plurality of calibration targets. Each calibration target has the same design as the device, but includes a known overlay shift. The calibration targets may be located in a scribe line, within a product area on the wafer, or on a separate calibration wafer. Each calibration target may have a different overlay shift, including zero overlay shift. The device may serve as a calibration target with zero overlay shift. The overlay shift may be in two orthogonal directions. The signal response to overlay may be determined based on a set of signals obtained from the calibration targets. A second set of signals may then be obtained from the device and the overlay determined based on the second set of signals and the determined signal response to overlay.

20 Claims, 8 Drawing Sheets

(51) Int. Cl.
*G03F 1/70* (2012.01)
*G03F 7/00* (2006.01)

(56) References Cited

U.S. PATENT DOCUMENTS

| | | | | |
|---|---|---|---|---|
| 2003/0223630 A1* | 12/2003 | Adel | ................ | G03F 9/7011 |
| | | | | 382/145 |
| 2019/0004438 A1* | 1/2019 | Amit | ................ | H01L 22/12 |
| 2020/0159129 A1* | 5/2020 | Manassen | ............ | G01B 11/272 |

OTHER PUBLICATIONS

International Search Report and Written Opinion dated Jul. 22, 2022 for PCT Application No. PCT/US2022/022508, filed Mar. 30, 2022.

* cited by examiner

Sensitivity

MULTI-LAYER CALIBRATION FOR EMPIRICAL OVERLAY MEASUREMENT

CLAIM OF PRIORITY UNDER 35 U.S.C. § 119

This application claims under 35 U.S.C. § 119 the benefit of and priority to U.S. Provisional Application No. 63/168,181, filed Mar. 30, 2021, and entitled "MULTI-LAYER CALIBRATION FOR EMPIRICAL OVERLAY MEASUREMENT," which is assigned to the assignee hereof and is incorporated herein by reference in its entirety.

FIELD OF THE DISCLOSURE

Embodiments of the subject matter described herein are related generally to optical metrology, and more particularly to alignment metrology.

BACKGROUND

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. Typically, the photomask has alignment targets or keys that are aligned to fiduciary marks formed in the previous layer on the substrate. However, as the size of integrated circuit features continues to decrease, it becomes increasingly difficult to measure the overlay accuracy of one masking level to the previous level. This overlay metrology problem becomes particularly difficult at submicrometer feature sizes where overlay alignment tolerances are reduced to provide reliable semiconductor devices.

The overlay measurement problem is compounded when one or more material layers are formed using multiple patterns, thereby producing a structure with multiple potential overlay errors. For example, a single layer may include two or three or more patterns produced by different reticles, with one or more overlying patterned layers, where each pattern must be accurately aligned with all other patterns. Alternatively, multiple layered patterns, e.g., more than two layers, may be formed with separate reticles, where again, each pattern must be accurately aligned with a preceding pattern. When three or more patterns are present, the alignment between each pattern must be measured resulting in two or more overlay error measurements. Conventionally, to measure multiple overlay errors, a separate set of targets is generated for each individual overlay error and the overlay errors are separately measured. Consequently, a large footprint is required for the large number of targets and throughput is reduced due to the number of separate measurements required.

SUMMARY

The overlay of a device under test may be determined using signals acquired from the device and a signal response to overlay that is determined using a plurality of calibration targets. Each calibration target has the same design as the device under test, but includes a known overlay shift. The overlay shifts for the calibration targets differ and may include a zero overlay shift. In some implementations, the device under test may serve as one of the calibration targets, e.g., with a zero overlay shift. The overlay shift may be in two orthogonal directions. Moreover, there may be overlay shifts for multiple layers. The calibration targets may be located in a scribe line, within a product area on the wafer, or on a separate calibration wafer. The signal response to overlay may be determined based on a set of signals acquired from the calibration targets. A second set of signals may be obtained from the device under test and the overlay for the device may be determined based on the second set of signals and the determined signal response to overlay.

In one implementation, a method of overlay control of a device includes obtaining a first set of signals from a plurality of calibration targets, wherein each calibration target has a same pattern as the device, each calibration target having a known overlay shift in the pattern. Signal responses to overlay are determined based on the first set of signals. A second set of signals are obtained from the device. An overlay error in the device is determined based on the second set of signals and the signal responses.

In one implementation, an optical metrology device is configured for overlay control of a device. The metrology device includes a light source that produces light that is incident on and reflected by a sample and at least one detector that receives the light after it is reflected by the sample. The metrology device further includes at least one processor coupled to the at least one detector. The at least one processor is configured to obtain a first set of signals from a plurality of calibration targets, wherein each calibration target has a same pattern as the device, each calibration target having a known overlay shift in the pattern. The at least one processor is further configured to determine signal responses to overlay based on the first set of signals. The at least one processor is further configured to obtain a second set of signals from the device. The at least one processor is further configured to determine an overlay error in the device based on the second set of signals and the signal responses.

In one implementation, an optical metrology device is configured for overlay control of a device. The metrology device includes a light source that produces light that is incident on and reflected by a sample and at least one detector that receives the light after it is reflected by the sample. The metrology device further includes a means for obtaining a first set of signals from a plurality of calibration targets, wherein each calibration target has a same pattern as the device, each calibration target having a known overlay shift in the pattern. The metrology device further includes a means for determining signal responses to overlay based on the first set of signals. The metrology device further includes a means for obtaining a second set of signals from the device. The metrology device further includes a means for determining an overlay error in the device based on the second set of signals and the signal responses.

DETAILED DESCRIPTION

Figure 1A:
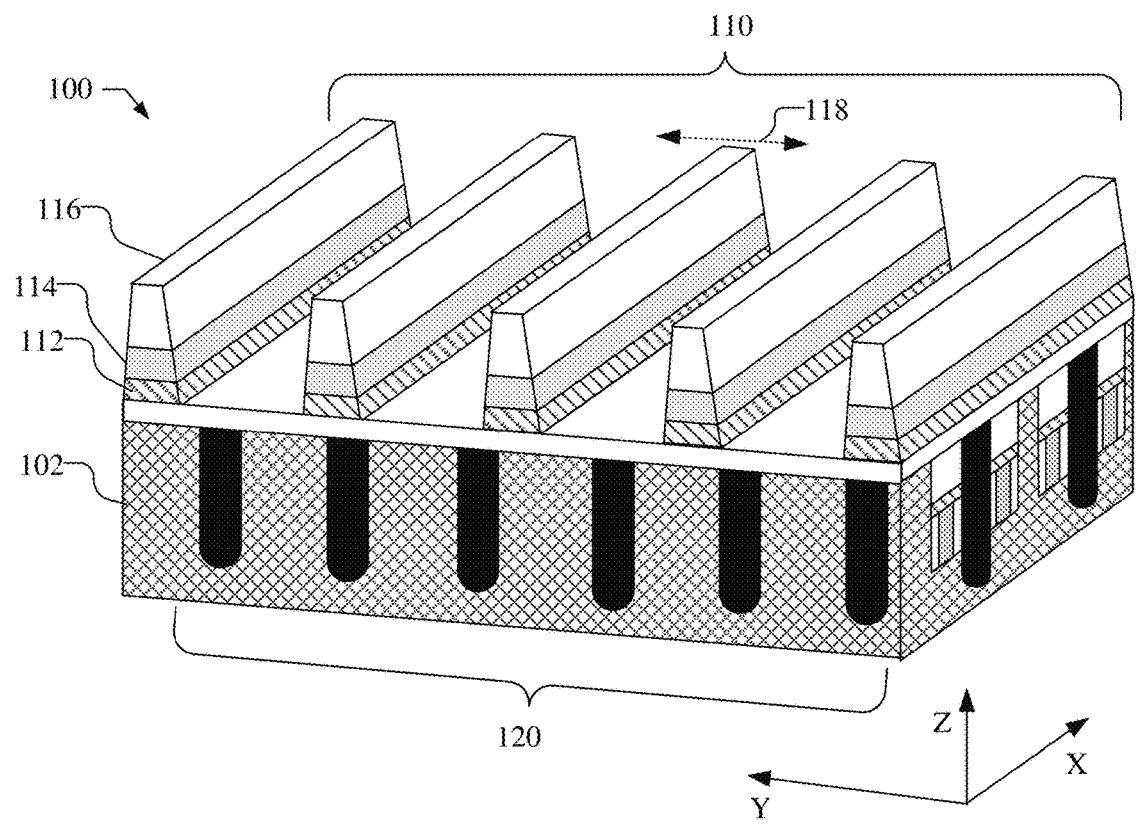
FIG. 1A illustrates an isometric view of a structure of a device for which on-device overlay measurement may be determined.

During fabrication of semiconductor and similar devices it is sometimes necessary to monitor the fabrication process by non-destructively measuring the devices. Optical metrology is sometimes employed for non-contact evaluation of samples during processing. Overlay is one type of measurement that is employed to ensure that the deposition and patterning of material layers such as insulating layers, polysilicon layers, and metal layers, are properly aligned. Overlay is sometimes measured using overlay targets that are constructed in the scribe lines of semiconductors. The overlay targets, for example, may be a box-in-box or cross-in-box type targets that are imaged where the alignment (or mis-alignment) between the patterns in the targets can be detected based on the relative locations of the components in the overlay targets. Another type of overlay target is designed for diffraction based overlay metrology. Diffraction based overlay targets are periodic patterns that are designed to diffract light which may be measured to determine the alignment (or mis-alignment) between the patterns in the targets. The measured alignment (or mis-alignment) between the patterns in the overlay targets is presumed to correspond to the alignment (or mis-alignment) between the patterns in the structures of the semiconductor devices being fabricated.

Measurement of overlay using specially constructed targets in the scribe lines of semiconductors, however, is no longer adequate to achieve pattern alignment control in state-of-the art processes. This is true of measurement both after patterning (termed ADI for After Develop Inspection) and after further processing (collectively referred to here as ACI for After Clean Inspection)). For example, process overlay tolerance in state-of-the art DRAM and logic processes is approximately 2 nm. With a standard 10% portion of this error budget allowed by the measurement tool, total measurement uncertainty (TMU) of 0.2 nm is required. There is a difference in the overlay measured based on test targets in the scribe area between devices and the overlay of the device itself, and these errors are a significant problem in reaching a TMU goal of 0.2 nm. The difference, for example, may arise from many sources, including but not limited to local stress difference because the pattern densities differ, and varying response to scanner aberrations. Similar issues arise with other devices, such as 3D NAND structures. Despite overlay budgets in 3D NAND that are at typically 20 or more times those in DRAM, the much taller structures found in 3D NAND devices increase the scribe-to-die difference. Accordingly, measurements performed directly on the device are desirable.

An additional advantage of performing overlay measurements directly on the device is that measurements may be made at many more locations. Scribe line measurements, for example, are limited to where the custom targets have been printed, and there are seldom more than thirty such patterns in each shot. Overlay target locations are conventionally confined to the scribe areas and this limits the density of measurement and hence the extent to which complex patterns of overlay error can be detected. Naturally, the chief concern is with overlay error in the device being fabricated and, accordingly, measuring overlay directly from the device pattern would be an improvement over using special test structures located off the device.

Special overlay test targets are typically printed only with patterns for layers of interest. Generally, but not necessarily, the layers of interest are the most recently patterned film and one previous pattern for which alignment is critical. Frequently, the patterns of the test target are chosen to aid the measurement technology and do not replicate the device layout, which is another reason for the differences between the overlay measured on these test targets and the actual on-device overlay.

Where more than two patterns are present, e.g., on a single layer or over multiple layers, multiple overlay errors may be present that must be separated to extract overlay on a layer by layer basis, which is essential if the results are used in process control through feedback. A high-resolution imaging tool, such as an scanning electron microscope (SEM), may, in some cases, provide an image in which the different layers can be separated by image processing techniques, and hence may measure some overlay errors directly. The usefulness of this method is limited, however, by how well the layer patterns are separated in the image, how well the electron beam penetrates to the underlying pattern of interest, and the likelihood of damage to the device by the beam.

Optical methods, for example, in the near UV to mid infra-red ranges, may be used to measure devices in a non-destructive fashion. Technologies such as Spectroscopic Ellipsometry (SE) are used to generate measurements of many properties of devices, such as Optical Critical Dimension (OCD) measurements, and may collect information about patterns that are buried below the surface. This capability makes OCD a suitable basis for on-device overlay measurement that includes multiple pattern-to-pattern overlay errors within the device. The general term Scatterometry Based Overlay (SBO) is sometimes used for this capability. Alternative optical metrology techniques may also be used, such as those using diffraction (Diffraction Based Overlay (DBO)), which generally measures the strength of first order diffraction, or the strength of specular reflection (zeroth order diffraction).

With the use of technologies, such as SBO or DBO, a model of light scattering from the device patterns is typically employed. For example, using modeling, the overlay errors may be included in a model for light scattering from the device patterns and a regression fit is performed for the overlay error along with other process properties to determine a measurement of the overlay error. However, while OCD works well for critical dimension and thin film measurements, this method is impractical for overlay measurements because of the relatively weak contributions to signals produced by overlay errors, which are hidden by responses to other properties such as critical dimension and film thickness.

Additionally, machine learning (ML) methods may be used to train the signal response to overlay, which is determined from reference measurements. These are termed empirical methods and are sometimes differentiated using the abbreviations eSBO or eDBO from model-based measurement. The methods employed by ML are limited if only reference data for the current layer is used in training because, as has been noted, the signals detected are in most cases influenced by overlay in underlying layers. Further limitations arise when the effect of these contributions on the signal are correlated and the tool has no means of separating these contributions, when the reference data comes from inaccurate scribe line measurements, or relies on destructive methods such as those used by some SEM based methods.

The above limitations may be addressed using on-device overlay measurement, as described herein, using multi-layer calibration of the overlay signal response, which accounts for all patterning steps and does not require data from a different tool for the purpose of calibration.

For example, for on-device overlay measurements, a first set of signals from a plurality of calibration targets may be obtained. Each calibration target may have a same design, e.g., combination of layers and patterns as the structure of the device under test. Each layer, for example, may be a single film, and each pattern may be the result of a single lithography operation. Each pattern on a calibration target is the same as the pattern on the structure of the device under test, but the pattern on each calibration target has a known overlay shift (sometimes referred to as a programmed overlay shift) imposed on the pattern. The calibration targets, for example, may be in the scribe line on the same wafer as the device, or located within the production area on the wafer that includes the device, or may be on a separate calibration wafer. Multiple calibration targets are used, each may have a different programmed overlay shift. In some implementations, the device under test itself, which may be considered to have a programmed overlay shift of zero, may be used as one of the calibration targets. Moreover, the overlay shift in the calibration targets may be in two orthogonal directions. Signal responses to overlay may be determined based on the first set of signals obtained from the calibration targets. A second set of signals may then be obtained from the device under test. The overlay error of the device under test may then be determined based on the second set of signals and the signal responses to overlay that were determined from the calibration targets.

FIG. 1A, by way of example, illustrates an isometric view of a structure of a device 100 for which on-device overlay measurement may be determined. The device 100 is illustrated as including a number of patterned lines 110 and underlying patterned lines 120 on a substrate 102. The lines 110 may include a number of different layers 112, 114, and 116, which are patterned to produce the resulting lines 110. The alignment of the patterned lines 110 with respect to the underlying patterned lines 120, for example, may be measured.

The overlay measurement of device 100 may be performed using a multi-layer calibration of the overlay signal response from a plurality of calibration targets, each having the same design as device 100. Each calibration target, however, will have a known overlay shift between the patterned lines 110 with respect to the underlying patterned lines 120, as illustrated by arrow 118 as shifting along the Y axis. The overlay shifts for the calibration targets may be zero, and non-zero shifts that may differ in direction and magnitude.

Figure 1B:
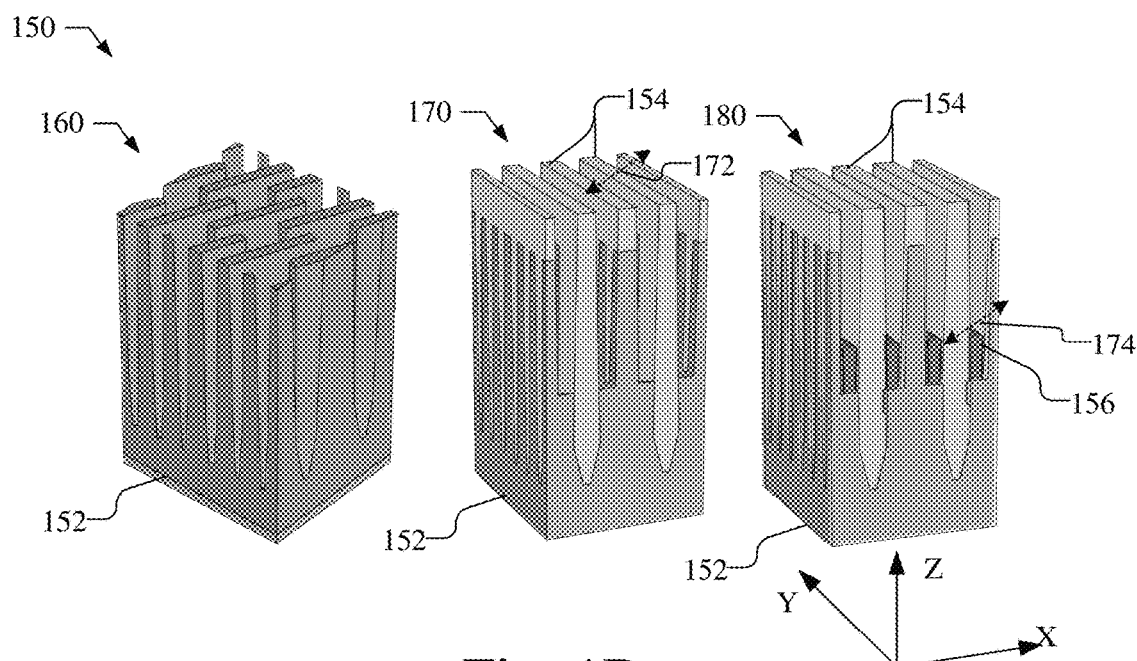
FIG. 1B illustrates an isometric view of the fabrication of another device for which on-device overlay measurement may be determined.

FIG. 1B, by way of example, illustrates an isometric view of the fabrication of another device 150 for which on-device overlay measurement may be determined. For example, structure 160 illustrates the shallow trench isolation (STI) etch of a silicon substrate 152, after which STI chemical mechanical polishing (CMP). Structure 170 illustrates the device after the word line (WL) etch and oxide 154 deposition and patterning. Structure 180 illustrates the device after the WL recess and tungsten 156 deposition and patterning.

It may be desirable to perform inspection of the device 150 at multiple points during the fabrication of the device 150. For example, overlay inspection of the device 150 may be performed after the STI etch illustrated in structure 160 e.g., STI ACI, as well as before after pattern development for the WL etch, e.g., WL etch ADI, and after the WL etch illustrated in structure 180, e.g., WL etch ACI. Similarly, overlay inspection of the device 150 may be performed after pattern development for the WL recess, e.g., WL recess ADI, and after the WL recess illustrated in structure 180, e.g., WL recess ACI.

The overlay measurement of device 150 may be performed at any inspection point during fabrication using a multi-layer calibration of the overlay signal response from a plurality of calibration targets, each calibration target having the same design (e.g., combination of layers and patterns) as device 150 at that point in fabrication. Each calibration target, however, will have a known overlay shift imposed between the patterns. Moreover, each layer in the calibration target will have a known overlay shift with respect to other layers. For example, a calibration target produced for device 150 at the point in fabrication illustrated by structure 170 may include an overlay shift between patterned oxide layer 154 and the patterned substrate 152, as illustrated by arrow 172 as shifting along both the X axis and Y axis. Further, a calibration target produced for device 150 at the point in fabrication illustrated by structure 180 may include an overlay shift between patterned tungsten layer 156 and the patterned substrate 152 and patterned oxide layer 154, as illustrated by arrow 174 as shifting along both the X axis and Y axis. If desired, the overlay shifts may be along a single axis, but an additional calibration target may be required that has a shift along the orthogonal axis. The overlay shifts for the calibration targets may be zero, and non-zero shifts that may differ in direction and magnitude.

The empirical overlay metrology methods, as discussed herein, uses calibration to determine the relationship between a detected signal on the device under test and the overlay. Two methods may be used for performing the calibration: use machine learning methods to train a model connecting the measured signal to a reference overlay measurement and, using calibration targets that are generated using targets with the same design as the device under test, but with the relative position of patterns moved by applying a known shift in the patterns (sometimes referred to as programmed shifts, overlay shifts, programmed overlay shifts, or the like) e.g., as discussed in reference to FIGS. 1A and 1B, which allows an experimental determination of the signal change with overlay.

A linear relationship between the measured signal and overlay may be assumed, but a linear relationship is not essential for the process described herein. A linear relationship, however, is generally true for a total overlay shift (e.g., programmed overlay shift plus overlay error) that is a small fraction of the pattern pitch.

Figure 2:
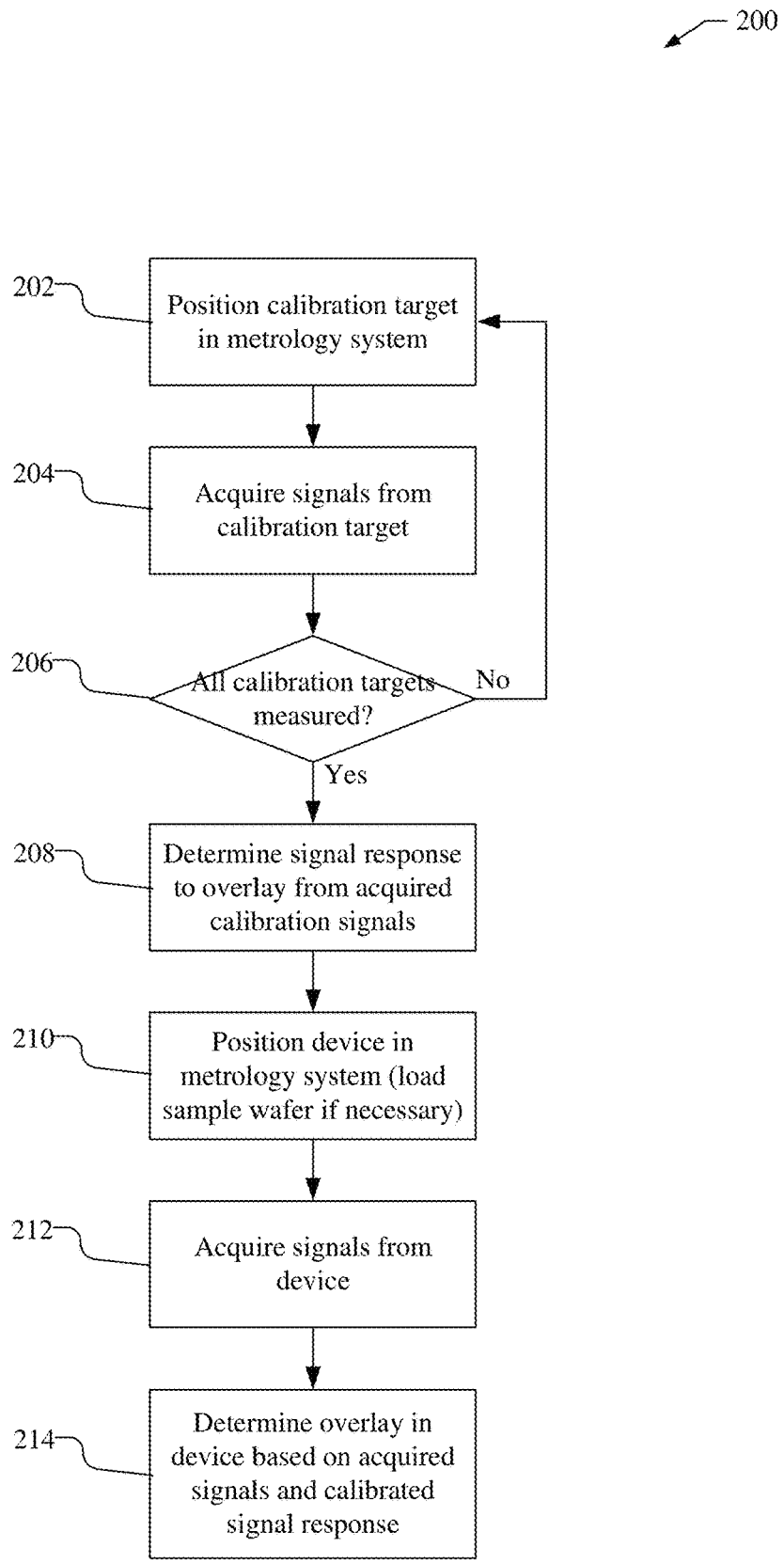
FIG. 2 illustrates a flow chart illustrating an example of the process of measuring overlay of a device using multi-layer calibration of the overlay signal response from a plurality of calibration targets.

FIG. 2 illustrates a flow chart 200 illustrating an example of the process of measuring overlay of a device using multi-layer calibration of the overlay signal response from a plurality of calibration targets. As illustrated, after loading a wafer or other substrate with calibration targets onto the metrology system, e.g., such as metrology device 800 illustrated in FIG. 8 or any other appropriate metrology device, a calibration target is positioned with respect to the metrology system (202). Signals are acquired for the calibration target (204) and additional calibration targets are aligned with the metrology system and signals acquired (206, 202, and 204) until all calibration targets have been measured (206). As described below, the calibration targets are on the same wafer as the device under test, e.g., in a scribe line or in the product area of the wafer, and/or on a separate calibration wafer.

Figure 3A:
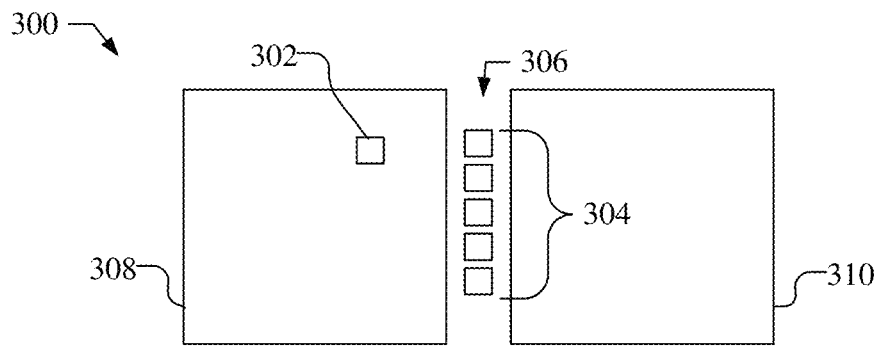
FIG. 3A illustrates a top plan view of a portion of a wafer that includes a device for which overlay is to be measured, and a plurality of calibration targets in a scribe line.

For example, in some implementations, the programmed shifts in the calibration targets may be introduced using programmed mask shifts which may be confined to calibration targets that are away from the device area, e.g., in the scribe lines, because the programmed mask shifts are not compatible with proper functioning of the device being manufactured. FIG. 3A, for example, illustrates a top plan view of a portion 300 of a wafer that includes a device 302 for which overlay is to be measured, and a plurality of calibration targets 304 each of which having the same design as the device 302 but that include program shifts between patterns, which may be produced using programmed mask shifts. As illustrated the calibration targets 304 are located in the scribe line 306 between product areas 308 and 310 of the wafer.

Figure 3B:
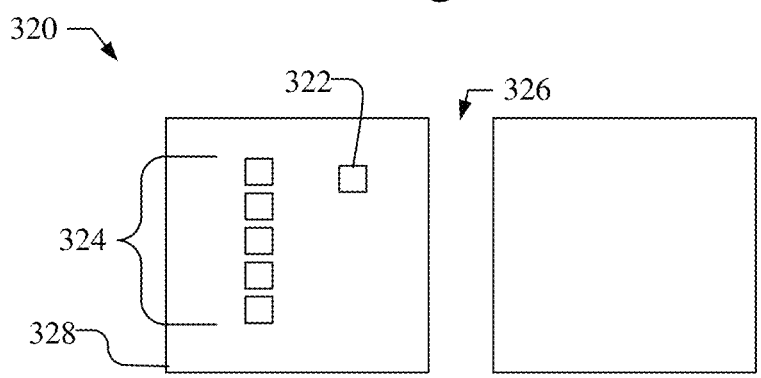
FIG. 3B illustrates a top plan view of a portion of a wafer that includes a device for which overlay is to be measured, and a plurality of calibration targets in a product area of the wafer with the device.

In some implementations, if the device remains within normal process tolerance when the mask shift is combined with normal overlay variation during manufacture, then the calibration target may be in a region in the product area of the wafer, e.g., that includes the device under test. FIG. 3B, for example, illustrates a top plan view of a portion 320 of a wafer that includes the device 322 for which overlay is to be measured, and a plurality of calibration targets 324 each of which having the same design as the device 322, and in fact, may be devices under fabrication. As illustrated, the calibration targets 324 are located in the product area 328 of the wafer that includes the device 322, as opposed to being in the scribe line 326.

Figure 3C:
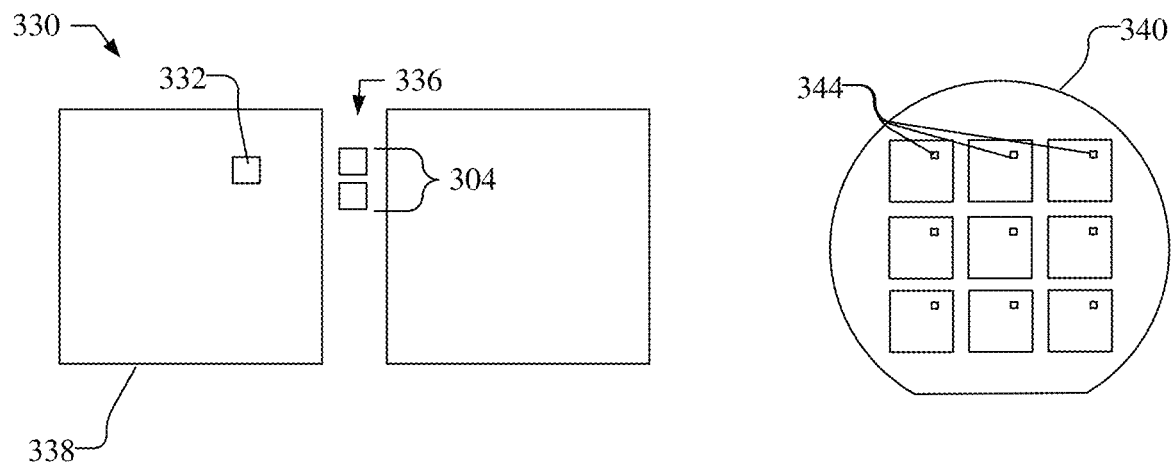
FIG. 3C illustrates a top plan view of a portion of a wafer that includes a device for which overlay is to be measured, and a separate calibration wafer that includes a plurality of calibration targets.

In another implementation, the programmed pattern shifts in the calibration targets may be introduced by the lithography tool. In this case, a calibration wafer may be used, and, accordingly, it is not necessary to place calibration targets in the scribe line of the wafer. FIG. 3C, for example, illustrates a top plan view of a portion 330 of a wafer that includes the device 332, e.g., in a product area 338 of the wafer, for which overlay is to be measured, and calibration wafer 340 that includes a plurality of calibration targets 344, each of which having the same design as the device 322, and in fact, may be device under fabrication. The calibration targets 344 on the wafer 340, however, are produced using patterned shifts that are introduced by the lithography tool. Producing calibration targets 344 by generating programmed pattern shifts in the device on a calibration wafer 340 using the lithography tool eliminates concerns that the calibration method is influenced by differences between overlay in the scribe and the device. Uncertainty in the programmed shifts may be higher if they are introduced by the lithography tool rather than in the mask, but as the purpose is to provide adjustment of the lithography tool, it is reasonable to assume that the lithography tool is capable of making the necessary small adjustments to produce the programmed shifts with sufficient accuracy. The lithography tool should be capable of making a sufficiently large change to overlay over a small enough distance such that other sources of overlay error may be assumed to be constant.

While the use of a calibration wafer removes the requirement for calibration targets in the scribe area, the calibration may only be learned using wafers to which overlay shifts have been applied. Accordingly, as illustrated in FIG. 3C, it may be advantageous to position some calibration targets 334 in the scribe line 336 for the purpose of validating the calibration on every wafer, though fewer such targets are needed than in the case where they are used for calibration.

The calibration targets in the product area and/or calibration wafer (e.g., illustrated in FIGS. 3B and 3C, respectively) may be combined with the calibration targets in the scribe line (illustrated in FIG. 3A), if the calibration targets closely replicate the device structure, i.e., if the design and processing of the calibration target patterns in the scribe line is the same as the design and processing of the device. Such calibration targets may be referred to as device-like. The measured signal response to the programmed overlay shifts in the calibration targets may then be applied to signals measured from areas with the same pattern designs in the device area, e.g., from the device under test. For accurate calibration, it is desirable that all other process conditions are the same for the calibration and device areas, for example, the calibration targets and device should have the same pattern critical dimension (CD) and film thickness. Hence the device-like calibration targets may not only use the same design as the device area, but may differ only in local overlay and programmed shift when manufactured. This limitation extends to the programmed shifts produced based on a programmed mask shift or programmed shifts introduced by the lithography tool, which must also not cause the calibration target shapes to differ from the product patterns in any other way. It should be understood that the condition for sameness between the calibration targets and the device under test is not absolute, i.e., exact equivalence of CD, etc. is not required, but should be the same within a reasonable tolerance, e.g., within normal process variations. If it is less tolerant then multiple calibrations may need to be supported for each process range to which it is tolerant. With calibration targets in the scribe line, local calibration may be performed provided the process changes are small within the area to which the calibration applies, and with the penalty of taking extra time to perform frequent re-calibration. In general, increased differences between the calibration and device patterns will degrade measurement accuracy.

The condition that the calibration targets and device are the same is met automatically if the calibration targets are within the product area (e.g., as illustrated in FIG. 3B) rather than in the scribe line (e.g., as illustrated in FIG. 3A), as well as if programmed shifts are produced with the lithography tool (e.g., as illustrated in FIG. 3C).

If the calibration target structures are insufficiently device-like then they can be used as sources of reference data to train the signal response at nearby locations within the device area, for example by using machine learning (ML) techniques. In this case the advantage of replicating the device structures in the calibration targets is reduced but is still present. This is because doing so addresses many sources of scribe-to-device overlay difference, such as greater fidelity in response to lithography tool aberrations, and because of other pattern specific processing effects such as distortion introduced by CMP or other process steps that induce local variation based on pattern density loading.

Calibration may be based on a model for the overlay error that is a function of the measured signal. A set of known reference measurements and a corresponding set of signals are required so that the properties and parameters of the function may be learned. Calibration may find the best coefficients in a fixed model or select the best model and its coefficients from a range of options. Selecting the best model and coefficients normally requires maximization of a goodness-of-fit indicator, or equivalently minimization of an error indicator. ML is a form of calibration, but other approaches are available, such as regression. Calibration approaches, however, are adversely affected by contributions from multiple layers if only a single layer is considered in the calibration step. Device structures after the second patterning step may include multiple sources of asymmetry that contribute to the measured signal unless they are below films that are opaque to the measuring technology. This restriction applies equally to patterns generated by non-lithographic pitch-splitting methods as to lithographic single- and multiple-patterning steps, because all sources of pattern asymmetry will contribute to the signal in the metrology tool. The multilayer calibration process, as discussed herein does not suffer from the same limitation.

Conventionally, overlay measurements targets are not device-like and are fabricated with patterns in the two layers of interest only, which are generally the resist film for the current patterning step and whichever previous step is most critical for alignment at the current layer. Further, it is not essential, and quite uncommon, for the patterns in such overlay measurement targets to have the same layout and pitch as the device, and instead the patterns are optimized for the measurement tool. If a current patterning step has critical alignment to more than one previous pattern then multiple sets of overlay measurement targets are required, e.g., a set of overlay targets for each pattern alignment, unless the metrology tool is capable of separating signals from multiple patterns simultaneously, for example, using an imaging technique. Such non device-like overlay targets are used for measurement of the overlay error that is present in the overlay targets themselves, which is presumed to be valid for the devices being fabricated. Moreover, signals from these overlay measurement targets will not be modified by asymmetries from layers other than those whose overlay error is desired, and accordingly, the measured signal response to overlay error determined from conventional overlay measurement targets cannot be used with measurements obtained directly from the devices under fabrication.

Device-like calibration targets, on the other hand, by definition include all contributing pattern layers, and while programmed overlay shifts may be applied at one or more layers, the measured signal, and hence the calibration, will respond to unprogrammed overlay shifts at all pattern layers. For accurate measurements achieved using device-like calibration targets, two conditions are important: differentiation of the signal contributions from multiple sources of asymmetry should be possible, and sufficient information from the calibration targets should be provided to allow calculation for at least overlay for the layer(s) of interest.

Most empirical overlay methods are not capable of separating signal contributions from multiple layers. For example, reflectometry has only a single signal property: reflected intensity. Spectral reflectometry measures sample reflectivity as a function of wavelength and could therefore differentiate the effects of multiple asymmetry sources if their contributions as a function of wavelength differ, but the reflectance signal is a weak indicator of total asymmetry and multi-layer contributions may be difficult to separate. Moreover, the pattern pitch in the device is small and accordingly diffraction-based tools reduce to reflectance tools because no diffraction orders are evanescent, and accordingly the same problems are present for diffraction-based tools.

One technique that may be used to measure overlay-sensitive signals from calibration targets (e.g., at block 204 of FIG. 2) and the device under test uses the Mueller matrix. The Mueller matrix formalization applies to all optical metrology systems, but different systems differ in how they respond to it. For example, a DBO system is dependent on the Mueller matrix as it describes how the signal strength changes with wavelength and with device properties. The same applies to a reflectometer. A spectroscopic ellipsometer, may be sensitive to the full Mueller matrix, or may respond to a subset of Mueller matrix, normally expressed in technology-specific combinations of some of the Mueller matrix elements. While measurements using a spectroscopic ellipsometer is sometimes referred to herein, it should be clear that signal formation is not dependent on using one specific type of metrology system to detect the sample Muller matrix, and that systems other than a spectroscopic ellipsometer may be used.

The Mueller matrix M is a 4×4 matrix that describes the sample being measured and is related to the Jones matrix J as follows (where T is defined in equation 4 and the Jones matrix J is described in equation 2):

$$M = TJ \otimes J^* T^{-1} \quad \text{eq. 1}$$

The Jones matrix describes the sample-light interaction as follows:

$$J = \begin{pmatrix} r_{ss} & r_{sp} \\ r_{ps} & r_{pp} \end{pmatrix} \quad \text{eq. 2}$$

$$\begin{pmatrix} E'_s \\ E'_p \end{pmatrix} = \begin{pmatrix} r_{ss} & r_{sp} \\ r_{ps} & r_{pp} \end{pmatrix} \begin{pmatrix} E_s \\ E_p \end{pmatrix}. \quad \text{eq. 3}$$

The Jones matrix depends on the angle of incidence, azimuth, wavelength as well as structural details of the sample. The diagonal elements describe the complex reflectance (amplitude & phase) for polarization orthogonal ($r_{ss}$) and parallel ($r_{pp}$) to the plane of incidence defined by the illumination and collection arms. The off-diagonal terms $r_{sp}$ and $r_{ps}$ are related to polarization conversion between s and p polarization states in the presence of sample anisotropy. The Jones matrix J elements, however, are not easily obtained experimentally. The elements of the 4×4 Mueller matrix M, however, can be derived experimentally.

The matrix T in equation 1 is used to construct the 4×4 Mueller matrix from the Jones matrix and is given by:

$$T = \begin{pmatrix} 1 & 0 & 0 & 1 \\ 1 & 0 & 0 & -1 \\ 0 & 1 & 1 & 0 \\ 0 & i & -i & 0 \end{pmatrix}. \quad \text{eq. 4}$$

The Mueller matrix M may be written in the Stokes formalism as follows:

$$\begin{pmatrix} s_0 \\ s_1 \\ s_2 \\ s_3 \end{pmatrix}^{out} = \begin{pmatrix} m_{11} & m_{12} & m_{13} & m_{14} \\ m_{21} & m_{22} & m_{23} & m_{24} \\ m_{31} & m_{32} & m_{33} & m_{34} \\ m_{41} & m_{42} & m_{43} & m_{44} \end{pmatrix} \begin{pmatrix} s_0 \\ s_1 \\ s_2 \\ s_3 \end{pmatrix}^{in}. \qquad \text{eq. 5}$$

The Stokes vector S is described as follows:

$$S = \begin{pmatrix} s_0 \\ s_1 \\ s_2 \\ s_3 \end{pmatrix} = \begin{pmatrix} |E_s|^2 + |E_p|^2 \\ |E_s|^2 - |E_p|^2 \\ 2\text{Re}(E_s E_p^*) \\ 2\text{Im}(E_s E_p^*) \end{pmatrix} = \begin{pmatrix} \text{total power } P \\ P_{0°} - P_{90°} \\ P_{45°} - P_{-45°} \\ P_{RHC} - P_{LHC} \end{pmatrix}. \qquad \text{eq. 6}$$

The Mueller matrix, and in particular the off-diagonal Mueller matrix elements, are sensitive to asymmetry and overlay. The overlay-sensitive signals are the four combinations of the off-diagonal sample Mueller matrix elements, which has strong contributions from overlay at each layer and can be differentiated through appropriate signal analysis.

Figure 4A:
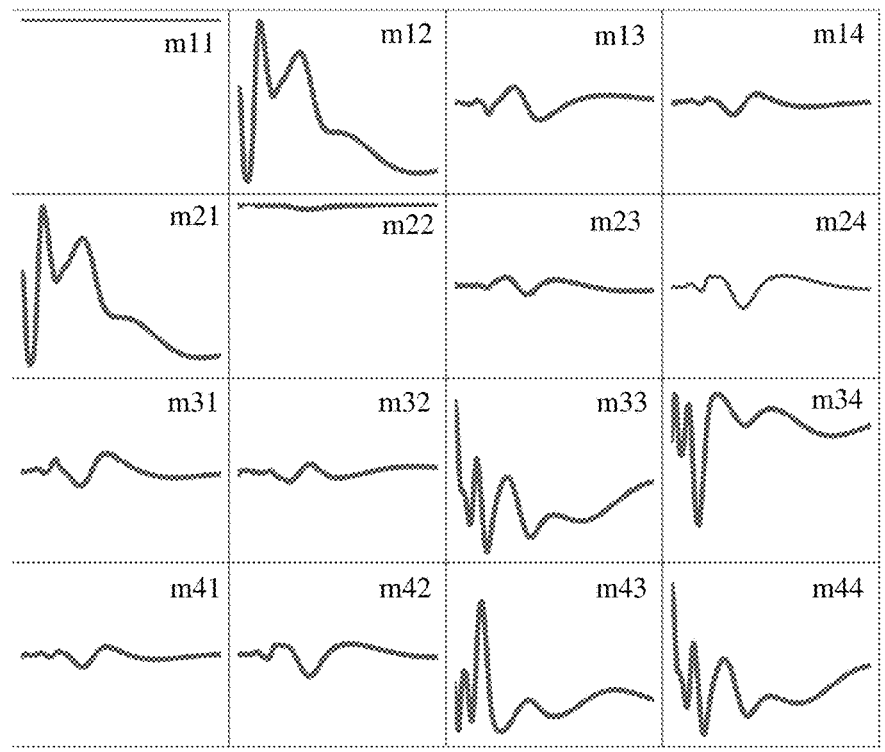
FIG. 4A illustrates an example of a full 4×4 Mueller Matrix array.
Figure 4B:
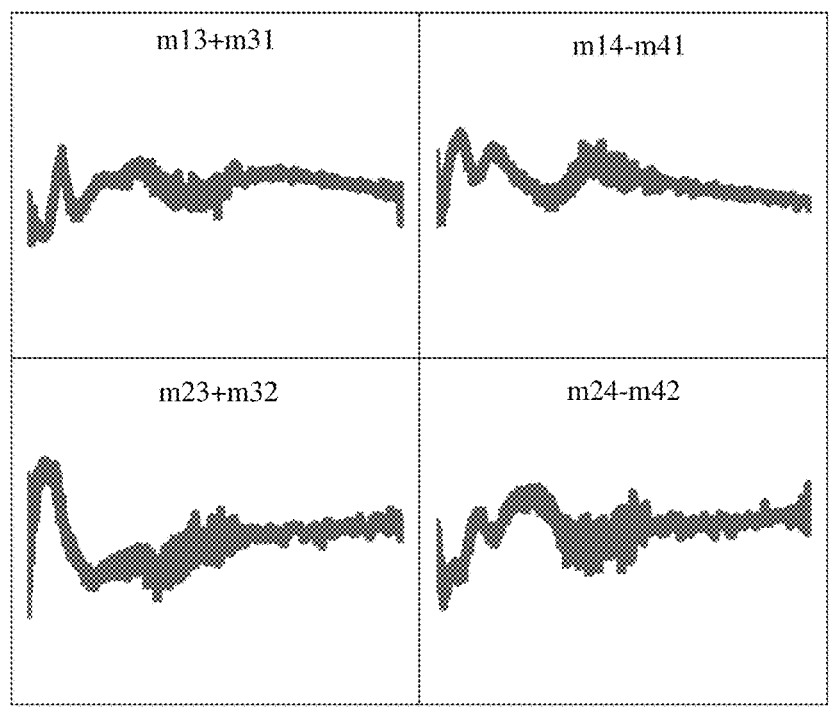
FIG. 4B illustrates an array of combinations of the off-diagonal sample Mueller matrix elements that are sensitive to overlay.

FIG. 4A, by way of example, illustrates a full 4×4 Mueller Matrix array 400 in which element m11 is used to normalize the remaining elements and each element is a function of a variable such as wavelength. The cross-polarization terms, i.e., the off-diagonal elements in the Mueller matrix are sensitive to asymmetry, and thus, overlay. For example, if the device being measured is symmetrical, i.e., there is no overlay error, combinations of the off-diagonal sample Mueller matrix elements will ideally be zero. As asymmetry is increased, i.e., overlay error increases, the combinations of the off-diagonal sample Mueller matrix elements will increase. FIG. 4B, by way of example, illustrates an array 450 of combinations of the off-diagonal sample Mueller matrix elements, m13+m31, m14−41, m23+m32, and m24−m42, which are sensitive to overlay.

The Mueller matrix may be measured by, e.g., an ellipsometer or spectroscopic ellipsometer, such as that described in FIG. 8 below, and the Jones matrix is calculated from first principles for a given sample. It should be understood that for measurement of overlay as discussed herein, not all of the elements of the Mueller matrix M are required. For example, the cross-polarization terms, i.e., the off-diagonal block spectra may be used. While a partial or full Mueller matrix may be captured by a Spectral Ellipsometer (MMSE), other devices, such as a DBO system, reflectometer, or image-based (IBO) tool, may not determine the Mueller Matrix elements directly but will measure overlay from signals characteristics arising from the asymmetric elements in the Mueller Matrix.

Unless overlay shifts may be applied to create calibration targets in regions of the device (e.g., as illustrated in FIG. 3B) or on calibration wafers (as illustrated in FIG. 3C), then space is needed for the calibration targets within the scribe region (as illustrated in FIG. 3A). It is desirable to minimize the size of this calibration area. MMSE may use two calibration targets because the measured signal is zero when there is no asymmetry (overlay is zero). Reflectance methods, on the other hand, may use three calibration targets because the measured signal is not zero when there is no asymmetry (overlay is zero). When overlay is measured in two directions, e.g., in the X and Y directions, then it is undesirable to use separate calibration targets for each direction as this requires twice the area. If the calibration is to be applied directly to overlay measurement in the device, then the effect of cross-correlations between signals arising from overlay along the two axes must also be considered.

Figure 5:
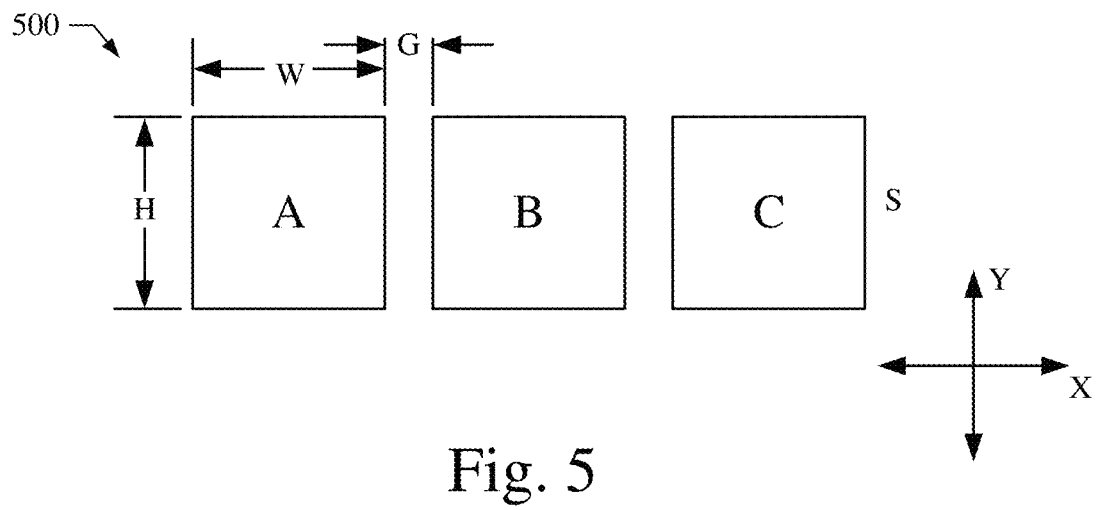
FIG. 5 illustrates a calibration target layout for two-dimensional calibration targets for a two-dimensional layer pair of a device under test.

FIG. 5 illustrates a calibration target layout for two-dimensional calibration targets 500 for a two-dimensional layer pair of a device under test. The calibration targets 500, for example, may be located in the scribe line, as illustrated in FIG. 3A. Each box, e.g., A, B, and C, represents a separate calibration target used to extract a signal during calibration. Each calibration target A, B, C, is device-like, i.e., has the same pattern as the device under test, but has a programmed overlay shift. The width W and height H of each calibration target A, B, and C are chosen to match the probe size of the metrology tool. The separation between boxes, G, is also chosen to suit the metrology tool and is in general small relative to the width W. Different pattern offsets are produced in the calibration targets A, B, C, based on the design in the mask layout for each of the targets A, B and C.

The calibration target layout shown in FIG. 5 may be used at the second patterning layer above an opaque (to the metrology tool) film, or equivalently above the unpatterned substrate, which is the first layer at which overlay measurement is relevant. Each of the three calibration targets A, B and C, have programmed overlay shifts in two orthogonal directions, e.g., along the X axis and Y axis, where the programmed overlay shifts are identified as $X_i$, $Y_i$, where i represents the calibration target and is one of A, B or C. The overlay shift may be programmed at any layer but may be patterned in the resist film. The gap (G) between calibration targets A, B, and C of similar design can be reduced to effectively zero to minimize the impact of edge effects of the probe beam with the structure, further minimizing target size. Additionally, scribe calibration targets behave most like a product when the pattern surrounding the target also has a layout density consistent with the devices. Ideally the surround (S) is a standard device structure at target registration and critical dimensions for the layers of interest. While FIG. 5 shows calibration targets 500 in a scribe line for simplicity, regions in the device area (as illustrated in FIG. 3B) or on a calibration wafer (as illustrated in FIG. 3C) with shifts programmed in the mask or by the lithography tool may also be used.

During measurement of the calibration targets, e.g., at blocks 202, 204, and 206 of FIG. 2, two signals are obtained from each calibration target, e.g., one signal for the overlay shift in each direction, e.g., along the X axis and the Y axis. These signals might be obtained simultaneously or at different times. For example, a signal parallel to the X axis and another signal parallel to the Y axis may be obtained. In some metrology tools, these signals are obtained simultaneously, e.g., if they come from processing an XY image, while in other metrology tools, such as some spectroscopic ellipsometers, two independent signal acquisitions are required. The signal for X-axis overlay from target i may be referred to as $S_{xi}$, and the signal for the Y-axis overlay from target i may be referred to as $S_{yi}$. The signals may be assumed to be additive, with the X-axis signals functions $f_{xx}(X)$ and $f_{xy}(Y)$ of overlay, with equivalent functions $f_{yx}(X)$ and $f_{yy}(Y)$ for Y-axis overlay, then with "true" overlay error of ($\varepsilon_x$, $\varepsilon y$):

$$S_{xi} = f_{xx}(\varepsilon_x + X_i) + f_{xy}(\varepsilon_y + Y_i) \qquad \text{eq. 7}$$

$$S_{yi} = f_{yx}(\varepsilon_x + X_i) + f_{yy}(\varepsilon_y + Y_i) \qquad \text{eq. 8}$$

It is usual and reasonable to assume that ($\varepsilon_x$, $\varepsilon_y$) is constant for closely spaced calibration targets.

Referring to FIG. 2, once the signals are acquired from the calibration targets at blocks 202, 204, and 206, the signal response to overlay is determined from the acquired calibration signals (208).

If the functions in equation 7 and equation 8 are linear in the X-axis and Y axis overlay, then they are of the form $$f_{\alpha\beta}(Z_\beta) = g_{\alpha\beta} Z_\beta + c_{\alpha\beta} \qquad \text{eq. 9}$$

where $g_{\alpha\beta}$ and $c_{\alpha\beta}$ are constants for each calibration target design and process properties (e.g., CD, thickness, side wall angle), $\alpha$ represents the measurement direction (X or Y) and $\beta$ is the direction of overlay error (also X or Y) and $Z_\beta$ represents the combined overlay shift and overlay error along axis $\beta$. Note that equation 9 does not apply to reflectivity tools where the signal cannot be negative. An equivalent treatment exists for reflectivity tools where the appropriate form for f is $$f_{\alpha\beta}(Z_\alpha) = g_{\alpha\beta} |Z_\alpha| + c_{\alpha\beta} \qquad \text{eq. 10}$$

Restricting the discussion to symmetry-based tools (those using signal differences, diffraction or MMSE, where the signal can be negative), $$g_{xx} = \frac{\frac{S_{xA} - S_{xB}}{Y_A - Y_B} - \frac{S_{xA} - S_{xC}}{Y_A - Y_C}}{\frac{X_A - X_B}{Y_A - Y_B} - \frac{X_A - X_C}{Y_A - Y_C}} \qquad \text{eq. 11}$$

$$g_{xy} = \frac{\frac{S_{xA} - S_{xB}}{X_A - X_B} - \frac{S_{xA} - S_{xC}}{X_A - X_C}}{\frac{Y_A - Y_B}{X_A - X_B} - \frac{Y_A - Y_C}{X_A - X_C}} \qquad \text{eq. 12}$$

$$g_{yx} = \frac{\frac{S_{yA} - S_{yB}}{Y_A - Y_B} - \frac{S_{yA} - S_{yC}}{Y_A - Y_C}}{\frac{X_A - X_B}{Y_A - Y_B} - \frac{X_A - X_C}{Y_A - Y_C}} \qquad \text{eq. 13}$$

$$g_{yy} = \frac{\frac{S_{yA} - S_{yB}}{X_A - X_B} - \frac{S_{yA} - S_{yC}}{X_A - X_C}}{\frac{Y_A - Y_B}{X_A - X_B} - \frac{Y_A - Y_C}{X_A - X_C}} \qquad \text{eq. 14}$$

Extensions for other non-symmetry-based metrology tools, such as reflectometers, are straightforward and may be determined by those of ordinary skill in the art in light of the above. From equations 11-14, it follows that ideally, all the $X_i$ shifts, and all the $Y_i$ shifts, are different. It should be noted that in equations 11-14, calibration target A serves as a reference target, to which the measured signals and programmed overlay shifts for the other calibration targets are compared.

The terms $g_{xy}$ and $g_{yx}$ are cross-correlation terms that allow for signals created at 90° to the overlay direction. In the case of orthogonal patterns, these terms are expected to be zero, or at least very small, but the calibration mechanism does not assume this is the case and so better supports DRAM patterns where diagonal patterns are common.

If overlay shifts are applied in one direction only, e.g., in the X-axis then all the orthogonal shift terms are zero. In this case $g_{xx}$ may be determined using only two targets, A and B:

$$g_{xx} = \frac{S_{xA} - S_{xB}}{X_A - X_B} \qquad \text{eq. 15}$$

but there is then no estimate for the cross-terms.

When equation 7 or equation 8 are expanded using equation 9, the sum of the two constant terms, $c_{\alpha x} + c_{\alpha y}$ can be written as a single constant $c_\alpha$:

$$S_{\alpha i} = g_{\alpha x}(\varepsilon_x + X_i) + g_{\alpha y}(\varepsilon_y + Y_i) + c_\alpha \qquad \text{eq. 16}$$

where $\alpha$ is the measurement direction X or Y.

Once the scale coefficients $g_{\alpha\beta}$ have been determined, it is possible to calculate both the real local overlay error at the calibration targets and, if data from device-like calibration targets are to be used for on-device measurement, the constant terms $c_\alpha$.

$$\varepsilon_x = -X_i + \frac{S_{xi}}{g_{xx}} - \frac{S_{yi}}{g_{xx}} \frac{g_{xy}}{g_{yy}} - \frac{c_x}{g_{xx}} + \frac{c_y}{g_{xx}} \frac{g_{xy}}{g_{yy}} \qquad \text{eq. 17}$$

$$\varepsilon_y = -Y_i + \frac{S_{yi}}{g_{yy}} - \frac{S_{xi}}{g_{xx}} \frac{g_{yx}}{g_{yy}} - \frac{c_y}{g_{yy}} + \frac{c_x}{g_{xx}} \frac{g_{yx}}{g_{yy}} \qquad \text{eq. 18}$$

Equation 17 and equation 18 can be applied to on-device measurement by setting $X_i = Y_i = 0$.

If the sample is rotated 180° and remeasured, the programmed overlay shift and true overlay error simply change sign since they are not dependent on measurement orientation. Denoting the signal when rotated with a prime, $$S'_{\alpha i} = -g_{\alpha x}(\varepsilon_x + X_i) - g_{\alpha y}(\varepsilon_y + Y_i) + c_\alpha \qquad \text{eq. 19}$$

Then $$c_\alpha = \frac{S_{\alpha i} + S'_{\alpha i}}{2} \qquad \text{eq. 20}$$

That is, the constant terms are the spectral equivalent of tool induced shift (TIS) in traditional overlay measurement and can be easily determined during the calibration process by performing additional measurements with 180° rotation of the calibration targets. Applying equation 20 to all three calibration targets A, B and C, should produce the same result for $c_\alpha$: in each case, allowing detection of capture errors and uncertainty levels or requiring only a single acquisition at 180°. Hence equation 17 and equation 18 can be used without needing to make assumptions about cross-talk between the signals in each axis or the signal value when overlay is zero.

This approach uses two calibration targets for calibration of one-dimensional (single-axis) overlay and three for calibration of two-dimensional (both X and Y) overlay.

It is assumed that the overlay errors $\varepsilon_x$ and $\varepsilon_y$ are the same for all the calibration targets. The linear distance occupied by N calibration targets in the scribe line is approximately N(W+G). If the overlay process tolerance is T and the scanner field width is $\Omega$, then for an in-control process the maximum variation in process overlay ($\delta\varepsilon$) between the outermost calibration targets is $$\max(\delta\varepsilon) = \frac{NT(W + G)}{\Omega} \qquad \text{eq. 21}$$

Applying worst-case values of $\Omega$=20 mm, W=50 μm, which can be considered an upper limit given the width of scribe lines, and G=10 μm, and N=3 the maximum process overlay change is 0.01T. This is a significant proportion of the target maximum measurement uncertainty 10%, but it should be noted that this is a worst-case estimate, which may be eased by placing the reference target A in the middle of the calibration target array and building it from the outside in, so that no single target is further from the reference target than half the array width.

The effect of calibration target proximity may be removed by fitting the measured overlay results to a standard model for overlay variation with position within the lithography tool shot. The model predicts the change in $\varepsilon_x$ and $\varepsilon_y$ between calibration target locations, which may then be corrected in the analysis. An iterative approach may be required, in which it is first assumed that $\varepsilon_x$ and $\varepsilon_y$ are constant, and then corrected in subsequent steps using the model fitted to measured overlay in the previous stage. For closely spaced targets it is unlikely that more than two iterations will be required, but more may be used if desired.

Accordingly, in block 208 of FIG. 2, based on the acquired calibration signals, the signal response to overlay may be determined as the scale coefficients $g_{\alpha\beta}$ and the constant terms $c_\alpha$. The above description, however, is based on overlay in only two layers. The concept for two layers and described in reference to FIG. 5 above may be extended to multiple layers, wherein one calibration target is added for every overlay vector to be measured.

Figure 6:
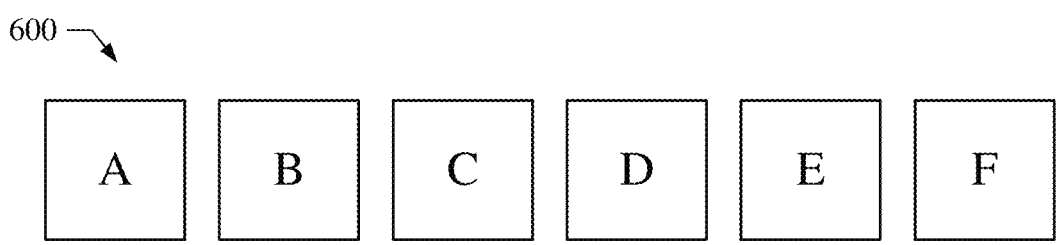
FIG. 6 illustrates a set of multi-layer calibration targets for a two-dimensional multi-layer device under test.

FIG. 6 illustrates a set of multi-layer calibration targets 600 for a two-dimensional multi-layer device under test. Similar to the calibration targets 500 shown in FIG. 5, the calibration targets 600 may be located in the scribe line, as illustrated in FIG. 3A, but may alternatively be located in the product area (as illustrated in FIG. 3B) or on a calibration wafer (as illustrated in FIG. 3C). Each box, e.g., A, B, C, D, E, and F represents a separate calibration target used to extract a signal during calibration. It should be understood that the number of separate calibration targets is dependent on the number of layers, and thus, additional or fewer calibration targets may be used than is shown in FIG. 6. Each calibration target A, B, C, D, E, and F is device-like, i.e., has the same pattern as the device under test, but has a programmed overlay shift.

Each calibration target A, B, C, D, E, and F receives the same processing, and same patterning, as the device area. As noted previously, if desired the programmed overlay shifts may be applied in the product area rather than to calibration targets in the scribe line. If the programmed overlay shifts are produced by the lithography tool, then the same calibration wafer or wafers should be used for each patterning step, and the programmed overlay shifts applied to different regions to produce an array of calibration targets equivalent to the layout shown in FIG. 6, although it is not necessary for the targets to be arranged in a line. A two-dimensional layout would be more compact and would reduce the effect of true overlay variation with location.

At each patterning step, programmed offsets are applied in as many calibration targets as desired. For calibration target i after patterning step L, the signal along axis $\alpha$ ($\alpha$=X or Y) is given by equation 22, subject to the same assumptions of linearity. Here $X_{ij}$ and $Y_{ji}$ are the overlay shift applied to target i at layer j, j≤L. The terms $\varepsilon_{xj}$ and $\varepsilon_{yj}$ are the overlay error in the respective X and Y directions at layer j. The terms $g_{\alpha X}$, $g_{\alpha X}$ and $c_\alpha$ are the same for every target in the array since every target is identical other than for the overlay shift.

$$S_{\alpha i} = \sum_{j=1}^{L} g_{\alpha Xj}(X_{ij} + \varepsilon_{xj}) + \sum_{j=1}^{L} g_{\alpha Yj}(Y_{ij} + \varepsilon_{yj}) + c_\alpha \qquad \text{eq. 22}$$

Equation 22 may be solved provided there are at least as many calibration targets as the combined number of terms $g_{\alpha X}$, $g_{\alpha X}$ and $c_\alpha$. Rewriting equation 22 in matrix form gives equation 23:

$$\begin{pmatrix} S_{\alpha 1} \\ S_{\alpha 2} \\ \ldots \end{pmatrix} = \begin{pmatrix} X_{11}+\varepsilon_{x1} & Y_{11}+\varepsilon_{y1} & X_{12}+\varepsilon_{x2} & \ldots \\ X_{21}+\varepsilon_{x1} & Y_{21}+\varepsilon_{y1} & X_{22}+\varepsilon_{x2} & \ldots \\ \ldots & \ldots & \ldots & \ldots \end{pmatrix} \begin{pmatrix} g_{\alpha x1} \\ g_{\alpha y1} \\ g_{\alpha x2} \\ \ldots \end{pmatrix} + c_\alpha \qquad \text{eq. 23}$$

Following the approach used previously and subtracting the signal for a reference calibration target r from all others gives equation 24:

$$\begin{pmatrix} S_{\alpha 1}-S_{\alpha r} \\ S_{\alpha 2}-S_{\alpha r} \\ \ldots \end{pmatrix} = \begin{pmatrix} X_{11}-X_{r1} & Y_{11}-Y_{r1} & X_{12}-X_{r1} & \ldots \\ X_{21}-X_{r1} & Y_{21}-Y_{r1} & X_{22}-X_{r1} & \ldots \\ \ldots & \ldots & \ldots & \ldots \end{pmatrix} \begin{pmatrix} g_{\alpha x1} \\ g_{\alpha y1} \\ g_{\alpha x2} \\ \ldots \end{pmatrix} \qquad \text{eq. 24}$$

or $$S = Z \cdot G \qquad \text{eq. 25}$$

The size of the matrices is reduced by one, and it is convenient though not essential to use calibration target A as the reference target and assign it the index r=0. If the total number of $g_{\alpha X}$, $g_{\alpha X}$ and $c_\alpha$ terms is N, and there are N signals, then Z is square and $$G = Z^{-1} \cdot S \qquad \text{eq. 26}$$

From equation 26, it can be seen that a requirement when choosing the overlay shifts $X_{ij}$ and $Y_{ji}$ is that the matrix inverse $Z^{-1}$ exists for the N desired measurements at layer L. It is not necessary that there be more than one set of N targets meeting this condition, as the correct set is known and can be selected for data collection.

Equations 11-14 are a special case of equation 26 for N=3. The constant terms $c_\alpha$ in equation 23 can again be determined by collecting signals after a 180° rotation of the calibration targets and using equation 20.

If more targets than N are measured, then the best fit solution to equation 25 can be used, though at the expense of taking longer to collect the data.

To illustrate the process, a simplification may be used. Calibration target A is used as the reference target and is designed with zero overlay shift. All other calibration targets have zero overlay shift except for one at each one-dimensional pattern layer and two at each two-dimensional pattern layer. Using index 0 for the signal from calibration target A (i.e., the reference target), and for the two-dimensional case with overlay shifts in targets i and j for patterning layer L, then results for the scale components $g_{\alpha\beta L}$ for layer L are the same as equations 11-14 with $X_A$=0 and $Y_A$=0;

$$g_{xxL} = \frac{\dfrac{S_{xi}-S_{x0}}{Y_i} - \dfrac{S_{xj}-S_{x0}}{Y_j}}{\dfrac{X_i}{Y_i} - \dfrac{X_j}{Y_j}} \qquad \text{eq. 27}$$

$$g_{xyL} = \frac{\dfrac{S_{xi}-S_{x0}}{X_i} - \dfrac{S_{xj}-S_{x0}}{X_j}}{\dfrac{Y_i}{X_i} - \dfrac{Y_j}{X_j}} \qquad \text{eq. 28}$$

-continued $$g_{yxL} = \frac{\frac{S_{yi} - S_{y0}}{Y_i} - \frac{S_{yj} - S_{y0}}{Y_j}}{\frac{X_i}{Y_i} - \frac{X_j}{Y_j}}$$ eq. 29

$$g_{yyL} = \frac{\frac{S_{yi} - S_{y0}}{X_i} - \frac{S_{yj} - S_{y0}}{X_j}}{\frac{Y_i}{X_i} - \frac{Y_j}{X_j}}$$ eq. 30

From equations 27-30 the condition for the programmed overlay shifts used to calibrate the signal response to the overlay in the same pattern layer is $$\frac{X_i}{Y_i} \neq \frac{X_j}{Y_j}$$ eq. 31

This condition is equivalent to the requirement that Z in equation 25 and equation 26 has a valid inverse. According to equation 31 the overlay shifts applied to the two calibration targets cannot be the same values even with a sign change, which might otherwise be considered an evident arrangement. For example, if one calibration target is patterned with an overlay shift of X=10 nm and Y=10 nm, the other calibration target should not be designed with an overlay shift of X=−10 nm, Y=−10 nm.

Subject to the condition in equation 31, the range of overlay shifts may be chosen to give the best result depending on the application. For example, by selecting an overlay shift that is a small fraction of the pattern pitch, a linear relationship between the measured signal and overlay may be assumed. In some cases, the signal response to overlay is known to become nonlinear at large values. For example, where two layers of contact holes are aligned measurement ambiguity occurs when the overlay error is half the pattern pitch, and nonlinearity might occur at lower values. When choosing an upper value for the overlay shift, it is desirable to account for additional overlay introduced by normal process variation and any additional overlay that might be added for experimental and validation purposes, for example by programming the scanner to deliberately shift the printed pattern.

It is also desirable that the denominators in equations 27-30 are as large as possible, as this will reduce uncertainty in the measured $g_{\alpha\beta L}$ coefficients. Consideration should be taken on the programmed shift to not induce defect modes, such as a very thin sliver in a double pattern process or other potential modes as non-centered registration windows are not part of the design target.

An example of a suitable range would be to base the overlay shifts on the overlay process tolerance $T_\alpha$ for the layer being measured. In the general case, the tolerance varies with orientation, but a simple approach could set overlay shifts of $X_i=T_x$, $X_j=−T_x/2$, $Y_i=T_y/2$ and $Y_j=−T_y$. Then $$\frac{X_i}{Y_i} - \frac{X_j}{Y_j} = 1.5 \frac{T_x}{T_y}$$ eq. 32

$$\frac{Y_i}{X_i} - \frac{Y_j}{X_j} = -1.5 \frac{T_y}{T_x}$$ eq. 33

Any calibration target that is patterned with a zero overlay shift, such as the reference target used to derive equations 27-30, can be a portion of the product area of the wafer, e.g., the device under test, e.g., if a suitable region is close enough to the scribe line. This condition is normally met for memory products (DRAM and 3DNAND). The condition for "close enough" may be determined using the approach used to derive equation 21.

In addition, the approach used to derive equation 24 does not require that the same calibration target is used as the reference target. The purpose of the subtraction is to eliminate the unknown overlay error from the analysis. It is therefore possible to select different reference targets, either from the calibration array or from a nearby region of the device, e.g., the device under test, for the treatment of the signal at each calibration target. This allows selection of signals from pairs of targets chosen to minimize separation and hence to reduce any error arising from the assumption that the overlay error is the same in the two calibration targets.

This is especially useful where the calibration targets are regions of the device which receive overlay shifts programmed through the lithography tool. The lithography tool, for example, needs to be able to change the overlay shift from the programmed amount Z to the reference value, which may be zero, in a distance small enough that the non-programmed overlay error may be considered constant. This condition is easier to satisfy if each shifted region has its own reference region.

If the process overlay tolerance, T, is large and the typical in-wafer overlay variation significantly smaller, for example 50% or less of T, then all the calibration targets may be made using mask offsets in the device area (e.g., as illustrated in FIG. 3B) and no targets are needed in the scribe line. Mask offsets of $X_i=T_x/2$, $X_j=−T_x/4$, $Y_i=T_y/4$ and $Y_j=−T_y/2$ may be used. The calibration targets then need not be placed in a line to fit within the scribe line but can more conveniently arranged in a rectangular pattern to minimize the total overlay variation between them. This situation is more likely to occur in 3DNAND processes than DRAM, where the process tolerance T is smaller.

Accordingly, referring to FIG. 2, block 208, based on the acquired calibration signals, the signal response to overlay over multiple layers may be determined as the scale coefficients $g_{\alpha Xj}$, $g_{\alpha Yj}$ and constant term $c_\alpha$. The device under test may be positioned in the metrology system (210) and signals are acquired from the device under test (212), in the same manner as the calibration targets. The overlay of the device under test may then be determined based on the acquired signals and the calibrated signal response to overlay (214).

The calibration targets allow determination of the signal response at a pattern layer L to the overlay shifts in each patterning layer but does not allow the individual overlay errors to be measured from an acquisition of one pair of signals $S_x$ and $S_y$ in the device under test. For the purposes of overlay control, it is most important to know the overlay error for the most recent layer printed. If the measurement is made at the develop step, then the results may be used to adjust the lithography tool using standard semiconductor process control techniques.

If the same locations on the same wafer are measured at every patterning step, including pitch splitting steps, up to the current layer, then those measurements might be used as the overlay vectors for the previous layers using equation 22 with all $X_{ij}$ and $Y_{ij}$ terms set to zero for the on-device measurement:

$$S_\alpha = \sum_{j=1}^{L} g_{\alpha Xj}\varepsilon_{xj} + \sum_{j=1}^{L} g_{\alpha Yj}\varepsilon_{yj} + c_\alpha \qquad \text{eq. 34}$$

In one implementation, the terms of $g_{\alpha Xj}$, $g_{\alpha Yj}$ and $c_\alpha$ are known from calibration targets, and the overlay errors $\varepsilon_{\alpha j}$ for j<L are fed forward from previous measurements. If the cross-terms $g_{xyj}$ and $g_{yxj}$ are zero or sufficiently close to it then acquisition of a signal along axis α is sufficient to measure overlay along that axis at layer L. If the cross-terms are not close enough to zero, then acquisition along both axes is necessary even if it is only desired to control overlay in one axis. Further, if these results are to be fed forward for subsequent layer measurements where the cross-terms are not zero, then results for both axes are required for accurate measurement even if it is not necessary for overlay control at the current layer. The above-described process assumes that overlay at a lithography step is not modified by subsequent processing. This assumption, however, is known to be untrue. For example, overlay may be modified between a develop and post-etch measurement by asymmetry and other effects during the etch process.

In one implementation, the coefficients $g_{\alpha X}$, $g_{\alpha Y}$ and $c_\alpha$ are functions of another variable, such as wavelength, angle of incidence (AOI), polarization state, or any combination thereof. The signal from a spectral ellipsometer is a spectrum. A reflectance tool, e.g., reflectometer, may be fitted with a spectrometer and so its signals may also be functions of wavelength. Other metrology tools, for example those based on diffraction, even if operating as reflectometers in the absence of evanescent diffraction orders, may acquire signals at multiple discrete wavelengths through the use of color filters in the light path. The extension of $g_{\alpha X}$, $g_{\alpha Y}$ and $c_\alpha$ to become functions of a variable is not limited to wavelength, but may be a function of incident angle or polarization state. In all cases, collection of a few signals at discrete values of the variable, for example by using color filters, is less desirable than rapid collection for a wide range of variable values.

Figure 7A:
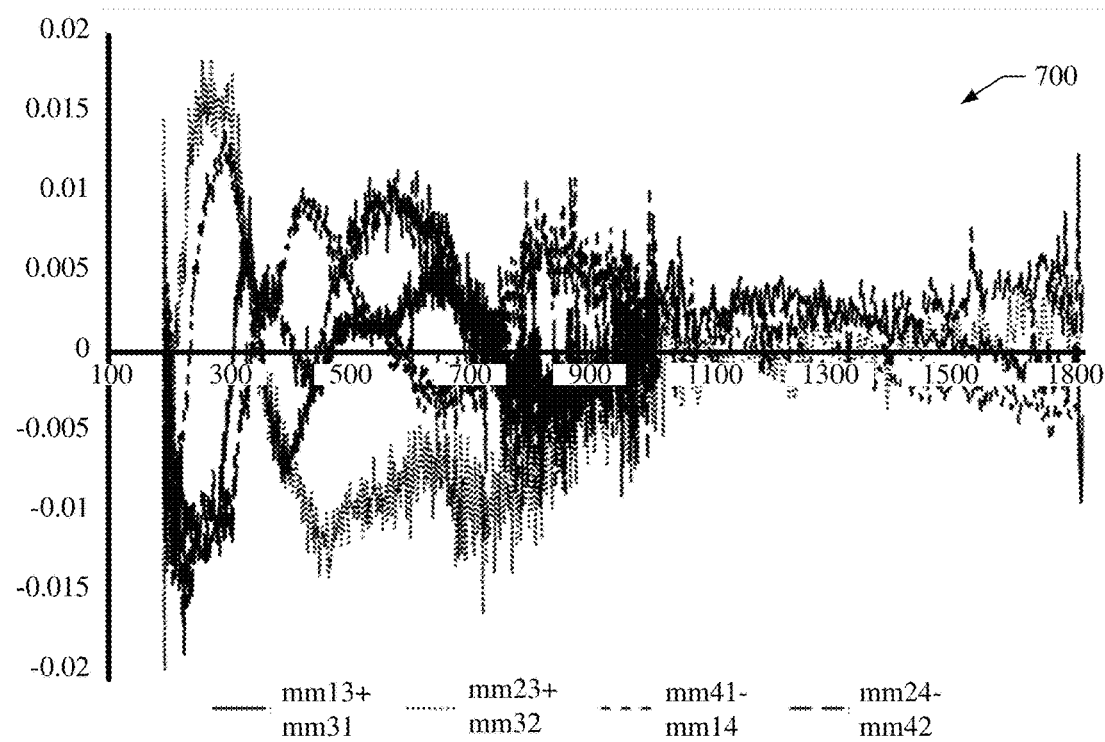
FIG. 7A illustrates an overlay signal response for a device under test.
Figure 7B:
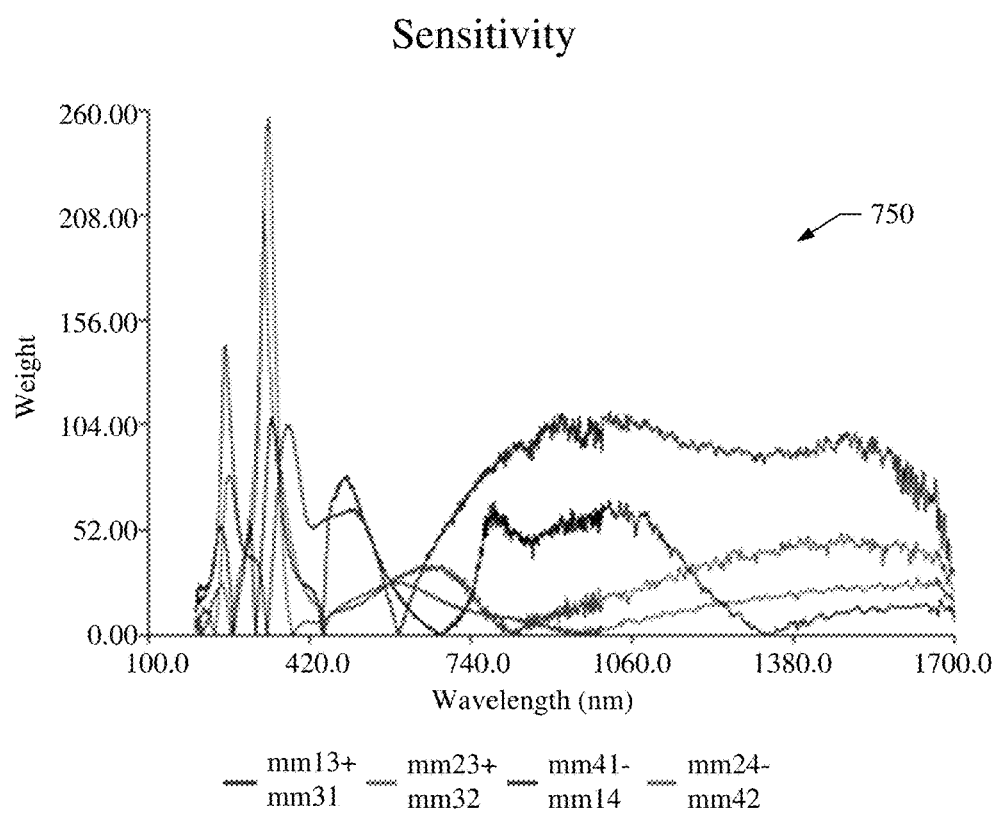
FIG. 7B is a graph that illustrates the sensitivity to overlay of the signals shown in FIG. 7A, calculated from the slope of a linear regression against a reference overlay measurement.

FIG. 7A illustrates an overlay signal response 700 for a device under test, where the X axis illustrates wavelength, and the Y axis is arbitrary units. The overlay signal response 700 is experimental data from one location in the device area of a semiconductor chip for the variation with wavelength of the signal in one axis from a Mueller-Matrix based SE (MMSE) tool. All four combinations of off-diagonal elements in the Mueller matrix are indications of asymmetry and so correspond to the signal $S_\alpha(\lambda)$, where the wavelength dependence of the signal has been made explicit for clarity. Performing multiple measurements at different locations on the wafer and calculating the regression slope against a reference overlay measurement for the current layer (e.g. $\varepsilon_{\alpha L}$) yields FIG. 7B. FIG. 7B is a graph 750 that illustrates the sensitivity to overlay of the signals shown in FIG. 7A, calculated from the absolute value of the slope of a linear regression against a reference overlay measurement. The strongest response occurs when the signal is mostly responding to the current layer overlay, i.e. $g_{\alpha\beta L}(\lambda)$ is stronger than any other term. The wavelengths at which the sensitivity is strongest is not the same for all Mueller matrix signal elements, showing that this signal is much richer than one based on a single parameter such as reflectivity.

Uncertainty in the measured $g_{\alpha\beta j}(\lambda)$ coefficients in a spectral tool may be reduced by performing local smoothing. Access to the full spectrum allows the smoothing process to be adjusted to the shape of the $g_{\alpha\beta j}(\lambda)$ curves and hence offers greater flexibility than in the discrete case. In a metrology tool operating at a few discrete wavelengths multi-wavelength averaging is performed by the pass bandwidth of each filter, and it is not possible to smooth further.

When expressed as a vector of a set of variables k, which may be wavelength and may be multi-dimensional, and sampled at discrete values of k, equation 34 becomes $$S_{\alpha k} = \sum_{j=1}^{L} g_{\alpha Xkj}\varepsilon_{xj} + \sum_{j=1}^{L} g_{\alpha Ykj}\varepsilon_{yj} + c_{\alpha k} \qquad \text{eq. 35}$$

where the subscript k has been added to indicate sampling of S at the intervals k, and calculation of the coefficients $g_{\alpha\beta j}$ and $c_{\alpha k}$ at the same intervals. In matrix form for a single variable k, equation 35 becomes $$\begin{pmatrix} S_{x1} \\ S_{y2} \\ \cdots \end{pmatrix} = \begin{pmatrix} g_{xx11} & g_{xy11} & g_{xx21} & \cdots \\ g_{yx11} & g_{yy11} & g_{yx21} & \cdots \\ \cdots & \cdots & \cdots & \cdots \end{pmatrix} \begin{pmatrix} \varepsilon_{x1} \\ \varepsilon_{y1} \\ \varepsilon_{x2} \\ \cdots \end{pmatrix} + \begin{pmatrix} c_{x1} \\ c_{y1} \\ \cdots \end{pmatrix} \qquad \text{eq. 36}$$

$$S = G \cdot E + C \qquad \text{eq. 37}$$

Then since the values G and C are known from calibration, overlay for all layers may be calculated from $$E = G^{-1} \cdot (S - C) \qquad \text{eq. 38}$$

provided that $G^{-1}$ exists. Other means of calculating the overlay values E are feasible. The requirement that the inverse of the matrix G exists requires at least as many samples of variable k as unknown overlay values, and a metrology tool that uses color filters to provide spectral sampling is unlikely to satisfy this condition. If desired, C may be determined by measurement at 0 and 180° orientations using equation 20, rather than using the value determined during calibration.

In one implementation, a sufficiently accurate model of the product structures may be used to create accurate simulations of the signal in the metrology tool, allowing values for the $g_{\alpha\beta j}(\lambda)$ coefficients to be predicted and for the effect of process variations, for example of CD or film thickness, to be modeled.

While a completely accurate model may eliminate the need for empirical calibration, in all but the simplest cases the model may be insufficiently detailed to replace the experimental approach.

Simulations may aid in smoothing experimental results by making the underlying shape of the $g_{\alpha\beta j}(\lambda)$ curves known.

The experimentally determined coefficients $g_{\alpha\beta j}(\lambda)$ may not be valid for all process conditions. Changes to critical dimensions, film thickness, edge shape and other properties may modify the responses and lead to increased measurement error and, as the process excursions increase, to failure of the method to adequately determine overlay. These changes will occur in all situations but will be especially noticeable in research and development lines where process changes are frequent, compared to production lines in which process conditions are relatively stable and change infrequently.

Simulation may help indicate the robustness of a given solution to process change, but as noted above, models are not normally accurate enough in real process environments to replace the experimental approach.

If overlay shifts in calibration targets are used, then at least one set of calibration targets are printed within each scanner field. For each calibration target set that is measured, on one or many wafers, a set of $g_{\alpha\beta j}(\lambda)$ coefficients is obtained. It is then possible to determine the variability of the $g_{\alpha\beta j}(\lambda)$ results with process variation as found on the measured wafers. Deliberate process variation can extend the determination to the entire process range, if desired.

If the tool is based on a technology that is also capable of performing OCD measurements, then the collected spectra can be used for that purpose as well as for overlay measurement. While OCD measurements might be useful for other purposes, it is not essential to measure the process properties. Instead, machine learning methods can be used to connect data from the collected spectra to the measured changes in the coefficients. This approach can be applied during measurement and used either to detect excursion beyond the safe operating region for the current calibration, or to modify the calibration to adapt to the process change.

If the calibration targets are produced by programmed mask shifts, the calibration targets will be present on all production wafers, in which case another approach is routinely to run calibration on every wafer during execution of a recipe, or less often as required. If desired, the frequency with which this is done and the area over which a calibration is assumed to be valid, can be determined from an experimental study of coefficient variation with process conditions. An alternative approach would be to perform calibration at a fixed interval in time or space, for example once per field or even more often, if there are more than one calibration set per field and apply the calibration from the closest point to any measurement location. The selected calibration area might be limited to the same scanner field as the in-device measurement, or a different condition used.

Performing calibration steps during measurement in this fashion will increase the overall time to measure each wafer. However, the number of calibration targets is of order 10 while modern on-product overlay sampling is 100 locations or more per field. The resulting increase of up to 10% in time to measure should be judged against any improvement in measurement capability or recipe robustness to process change.

If layout demands and space constraints necessitate, the individual calibration targets, e.g., illustrated in FIG. 6, may be locally distributed as long as the individual programmed overlay errors are maintained, the total overlay variation across the array remains small, and importantly the local pattern density around the individual elements is consistent.

Creating the calibration targets by programmed lithography tool overlay may be advantageous as it removes the need for special calibration targets in the scribe. In this case, special calibration wafers may be selected for calibration use and the programmed overlay shifts applied at each patterning step during processing. It may be advantageous to place a device-like validation target in the scribe line with a programmed two-dimensional mask shift, e.g., as illustrated in FIG. 3C. Comparison of the signal from this validation target with that from a nearby region of the device area allows validation that the calibrated slopes G remain valid, or alternatively to select G from a set of values for different process conditions. It is not necessary to provide a validation target for every patterning step, but it is advantageous to do so for at least the steps with the smallest tolerance to process induced overlay change.

The use of the multi-layer calibration method, as described here, allows the same analysis to be applied to each of the coefficients $g_{\alpha\beta j}(\lambda)$ and for each Mueller matrix-based asymmetry component. Analysis may select wavelength ranges for specific signal components that correspond most closely to overlay error at each layer, and the results applied to reduce the contribution of overlay error at layers other than the one of interest, which as noted is generally but not necessarily the most recently patterned layer. If desired, one or more other variables, such as AOI or polarization state, may be used instead of or in addition to wavelength. It is also possible to determine the overlay contributions from multiple layers from a single pair (X and Y axes) signal acquisition from a device structure, which is a further advantage of the technique.

The measurement of the signals from the calibration targets and the device under test may be performed using a reflectometer, ellipsometer, scatterometer or any other appropriate instrument. By way of example, FIG. 8 illustrates an optical metrology device 800, which may be a spectroscopic ellipsometer that may be used to perform the overlay measurement of a device using a calibrated response to overlay from a plurality of calibration targets based on at least a portion of the Mueller matrix, e.g., the off-diagonal elements. The sample 801 includes the device under test and/or the calibration targets, e.g., as illustrated in FIGS. 3A, 3B, and 3C. Sample 801 may be, e.g., a semiconductor wafer or flat panel display or any other substrate, and is supported by a stage 803, which may be a polar coordinate, i.e., R–θ, stage or an x-y translation stage, which may be controlled to place the calibration targets and device under test within the optical axis of the metrology device to acquire signals.

Optical metrology device 800 is illustrated as a rotating compensator ellipsometer 800 that performs measurements of the calibration targets and device under test on the sample 801 (and is sometimes referred to herein as ellipsometer 800). The ellipsometer 800 includes a polarization state generator (PSG) 802 and a polarization state detector (PSD) 812. The PSG 802 produces light having a known polarization state and is illustrated as including two broadband light sources 804 and 806, e.g., a Xenon Arc lamp and a Deuterium lamp, respectively, to produce light with a range of 200-3100 nm A beam splitter 808 combine the light from the light sources 804, 806 and a polarizer 810 produces the known polarization state. It should be understood that additional, different, or fewer light sources may be used if desired. Moreover, if desired, ellipsometer 800 may be monochromatic, with a variable angle of incidence to provide angle resolved measurements.

The PSD 812 includes a polarizing element, referred to as an analyzer 814, a spectrometer 816 and a detector 818, which may be, e.g., a cooled CCD array. The analyzer 814 is illustrated as being coupled to the spectrometer 816 and detector 818 via a fiber optic cable 820. It should be understood that other arrangements are possible, such as directly illuminating the spectrometer 816 from the analyzer 814 without the fiber optic cable 820.

The ellipsometer 800 is illustrated with two rotating compensators 822 and 824 between the PSG 802 and PSD 812. If desired, the ellipsometer 800 may use a single rotating compensator 822 or 824, e.g., between the PSG 802 and the sample 801 or between the sample 801 and the PSD 812, respectively. The ellipsometer 800 may further include focusing elements 826 and 828 before and after the sample 801, as illustrated in FIG. 8. The focusing elements may be, e.g., refractive or reflective lenses.

The ellipsometer 800 obliquely illuminates the sample 801, e.g., at a non-zero value of θ with respect to surface normal 801$_{normal}$. For example, the ellipsometer 800 may illuminate the sample 801 at an angle between 50° to 85°, for example at 65°, but other angles may be used if desired. As discussed above, if monochromatic light is used, the angle of incidence may be varied to derive an angle resolved measurement.

Figure 8:
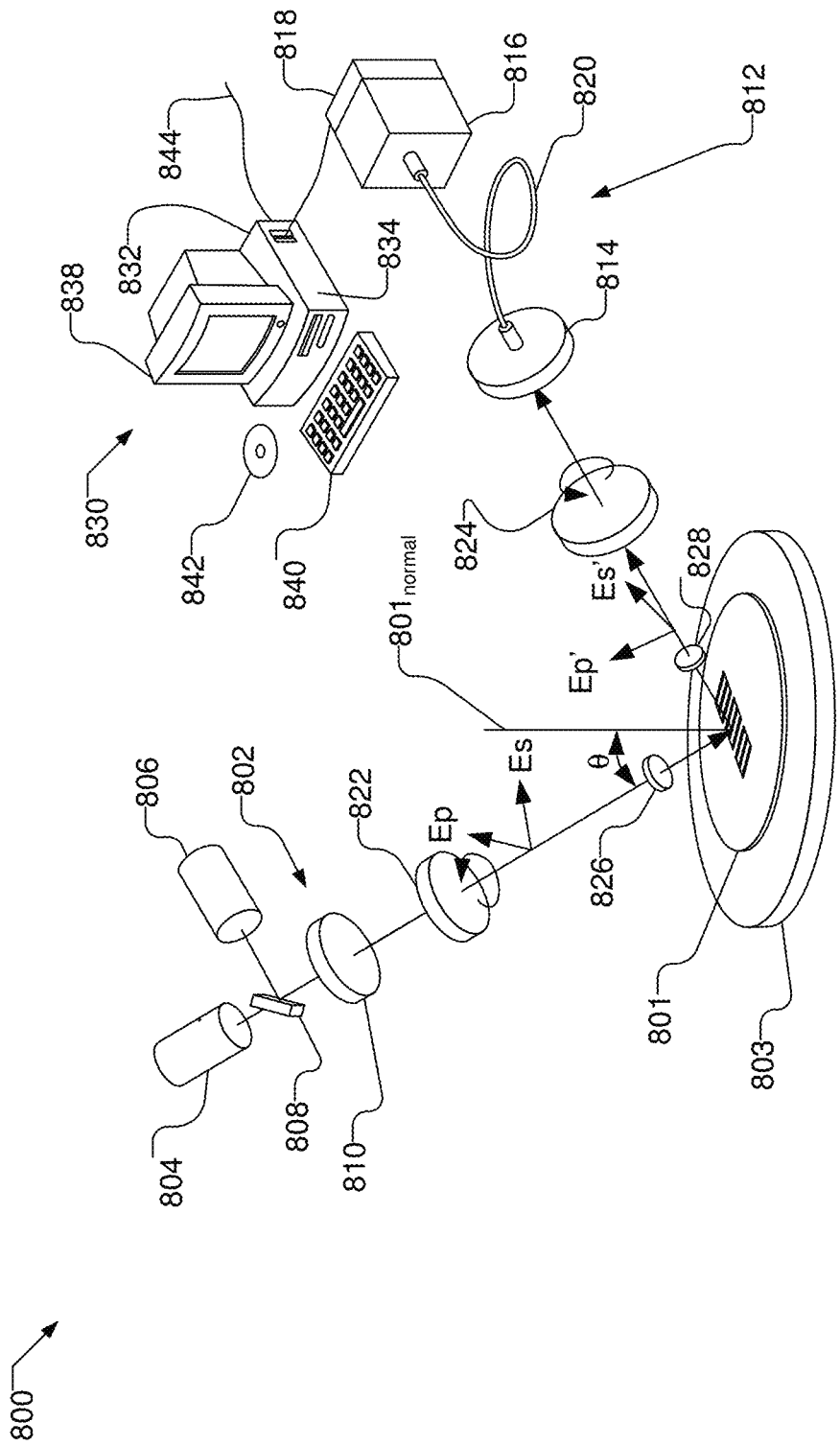
FIG. 8 illustrates an optical metrology device, in the form of a spectroscopic ellipsometer, that may be used to perform the overlay measurement of a device using a calibrated response to overlay from a plurality of calibration targets.

As illustrated in FIG. 8, the detector 818 is coupled to at least one processor 830, such as a workstation, a personal computer, central processing unit or other adequate computer system, or multiple systems. It should be understood that one processor, multiple separate processors or multiple linked processors may be used, all of which may interchangeably be referred to herein as processor 830, at least one processor 830, one or more processors 830. The processor 830 is preferably included in or is connected to or otherwise associated with optical metrology device 800. The processor 830, for example, may control the positioning of the sample 801, e.g., by controlling movement of a stage 803 that is coupled to the chuck. The stage 803, for example, may be capable of horizontal motion in either Cartesian (i.e., X and Y) coordinates, or Polar (i.e., R and θ) coordinates or some combination of the two. The stage may also be capable of vertical motion along the Z coordinate. The processor 830 may further control the operation of a chuck to hold or release the sample 801. The processor 830 may also collect and analyze the data obtained from the detector 818. The processor 830 may analyze the data to determine one or more physical overlays of a device under test using the signal response to overlay determined from calibration targets, as discussed herein.

The processor 830, which includes at least one processing unit 832 with memory 834, as well as a user interface including e.g., a display 838 and input devices 840. A non-transitory computer-usable storage medium 842 having computer-readable program code embodied may be used by the processor 830 for causing the at least one processor to control the optical metrology device 800 and to perform the functions including the analysis described herein. The data structures and software code for automatically implementing one or more acts described in this detailed description can be implemented by one of ordinary skill in the art in light of the present disclosure and stored, e.g., on a computer-usable storage medium 842, which may be any device or medium that can store code and/or data for use by a computer system such as processing unit 832. The computer-usable storage medium 842 may be, but is not limited to, flash drive, magnetic and optical storage devices such as disk drives, magnetic tape, compact discs, and DVDs (digital versatile discs or digital video discs). A communication port 844 may also be used to receive instructions that are used to program the processor 830 to perform any one or more of the functions described herein and may represent any type of communication connection, such as to the internet or any other computer network. The communication port 844 may further export signals, e.g., with measurement results and/or instructions, to another system, such as external process tools, in a feed forward or feedback process in order to adjust a process parameter associated with a fabrication process step of the samples based on the measurement results. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described. The results from the analysis of the data may be stored, e.g., in memory 834 associated with the sample 801 and/or provided to a user, e.g., via display 838, an alarm or other output device. Moreover, the results from the analysis may be fed back to the process equipment to adjust the appropriate patterning step to compensate for any detected variances in overlay.

Ellipsometry typically examines the changes in the p- and s-components of light caused by reflection or transmission from a sample. For example, light having a known polarization state from the PSG 802 is produced and incident on the sample and the resulting change in the polarization state is measured by the PSD 812. The change in polarization state is typically written as follows:

$$R_p = \frac{E'_p}{E_p}; \quad R_s = \frac{E'_s}{E_s}. \qquad \text{eq. 39}$$

In equation 39, $E_p$ and $E_s$ are the electrical vectors for the respective parallel and perpendicular components of the elliptically polarized incident light and $E'_p$ and $E'_s$ are the parallel and perpendicular components, respectively, of the elliptically polarized reflected light, and $R_p$ and $R_s$ are the reflection coefficients of the sample for the parallel and perpendicular components of light. The ellipsometric sample parameters ψ and Δ are then conventionally determined as follows:

$$\frac{R_p}{R_s} = \tan\psi e^{i\Delta}. \qquad \text{eq. 40}$$

Using at least the off-diagonal elements from the Mueller matrix produced by ellipsometer 800, the determination of the signal response at a pattern layer L to the overlay shifts in each patterning layer may be determined from calibration targets and applied to the measured signal from the device under test to determine the overlay as discussed above.

Figure 9:
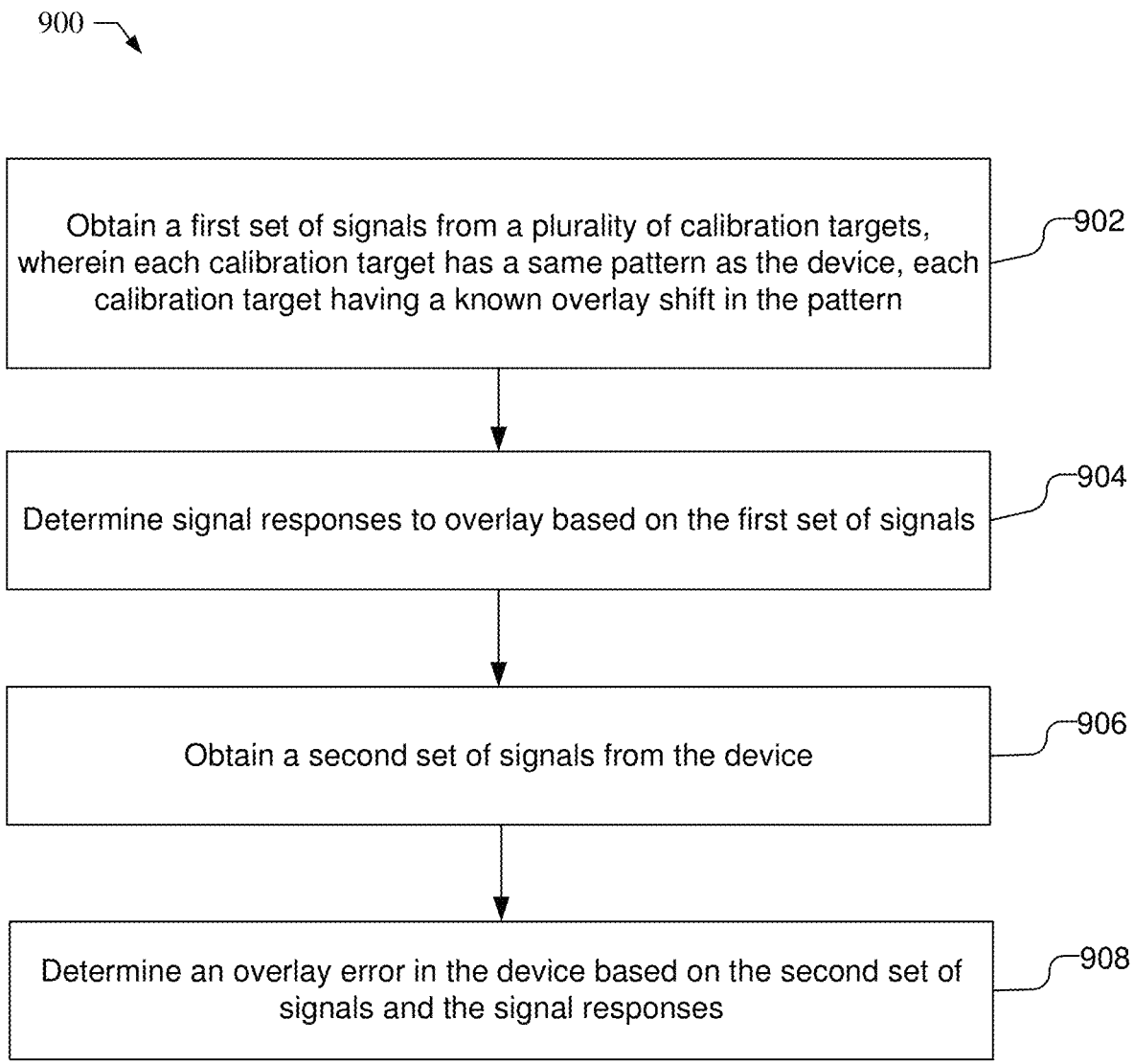
FIG. 9 is a flow chart illustrating a method of overlay control of a device using a calibrated response to overlay from a plurality of calibration targets.

FIG. 9 is a flow chart 900 illustrating a method of overlay control of a device, as discussed herein. The method may be performed using an optical metrology device, such a spectroscopic ellipsometer, such as illustrated in FIG. 8, a spectroscopic reflectometer, scatterometer, polarimeter, etc. At block 902, the optical metrology device obtains a first set of signals from a plurality of calibration targets, wherein each calibration target has a same pattern as the device, each calibration target having a known overlay shift in the pattern, e.g., as discussed in reference to blocks 202, 204, and 206 of FIG. 2. The known overlay shift in the pattern, for example, may be introduced by a programmed offset in a lithography mask, or may be introduced using adjustments to a lithography tool. The plurality of calibration targets, for example, may be located in a scribe line (e.g., as illustrated in FIG. 3A), or in a product area of a wafer with the device under test (e.g., as illustrated in FIG. 3B). The plurality of calibration targets may be produced on a calibration wafer that is separate from the wafer with the device under test (e.g., as illustrated in FIG. 3C). In some implementations, one or more of the calibration targets may have a zero overlay shift. For example, the device under test may serve as one of the calibration targets with a zero overlay shift or the calibration target with zero overlay shift may be proximate to the device under test. The known overlay shift may include overlay shifts that are in two directions. Moreover, the plurality of calibration targets may include two calibration targets for each pattern step on the device. The overlay shift in each calibration target may be selected such that a number of calibration targets used in the plurality of calibration targets is one greater than a number of separate overlay errors to be measured in the device. A means for obtaining a first set of signals from a plurality of calibration targets, wherein each calibration target has a same pattern as the device, each calibration target having a known overlay shift in the pattern, for example, may include a light source and detector, and optionally optical components, such as PSG 802 and PSD 812, such as illustrated in FIG. 8, and processor 830 with dedicated hardware or implementing executable code or software instructions in memory 834 or and/or medium 842 in the optical metrology device 800.

At block 904, the signal responses to overlay are determined based on the first set of signals from the plurality of calibration targets, e.g., as discussed in reference to block 208 of FIG. 2. For example, obtaining the first set of signals from the plurality of calibration targets may include obtaining a first signal from a first calibration target and a second signal from a second calibration target, and the signal responses may be determined by determining a difference signal based on the first signal and the second signal and then determining the signal responses based on the difference signal. The second calibration target, for example, may have a zero overlay shift, e.g., operate as a reference calibration target, and may be proximate to the first calibration target and/or may be the device under test. Where the known overlay shift includes overlay shifts in two directions and the plurality of calibration targets includes two calibration targets for each pattern step on the device, the signal responses are determined in both of the two directions. The plurality of calibration targets, for example, may be a number of calibration targets that is sufficient to permit the signal responses to overlay to be determined in the two directions for each pattern step of the device. Moreover, the first set of signals may be a function of one or more variables, such as one or more of spectra, polarization state, angle of incidence, or a combination thereof, which may be analyzed to separate contributions from each pattern step of the device. In some embodiments, the multiple signal responses to overlay may be determined for different process conditions. A means for determining the signal responses to overlay based on the first set of signals from the plurality of calibration targets, for example, may include the processor 830 with dedicated hardware or implementing executable code or software instructions in memory 834 or and/or medium 842 in the optical metrology device 800.

At block 906, the optical metrology device obtains a second set of signals from the device, e.g., as discussed in reference to blocks 210 and 212 of FIG. 2. A means for obtaining a second set of signals from the device, for example, may include a light source and detector, and optionally optical components, such as PSG 802 and PSD 812, such as illustrated in FIG. 8, and processor 830 with dedicated hardware or implementing executable code or software instructions in memory 834 or and/or medium 842 in the optical metrology device 800

At block 908, an overlay error in the device is determined based on the second set of signals and the signal responses, e.g., as discussed in reference to block 214 of FIG. 2. Where the first set of signals are a function of one or more variables, such as one or more of spectra, polarization state, angle of incidence, or a combination thereof, that are analyzed to separate contributions from each pattern step of the device, at least two signal responses may be used to determine an overlay error in one direction for each pattern step. In some implementations, at least three pairs of signal responses, for example, may be collected from the plurality of calibration targets at a same location and at the two directions and used to determine an overlay error for each pattern step and each direction. A means for determining an overlay error in the device based on the second set of signals and the signal responses, for example, may include the processor 830 with dedicated hardware or implementing executable code or software instructions in memory 834 or and/or medium 842 in the optical metrology device 800.

Additionally, in some implementations, the overlay error in the plurality of calibration targets may be determined based on the signal responses from the first set of signals.

In some implementations, e.g., where the plurality of calibration targets is on a calibration wafer that is separate from the wafer with the device under test, the optical metrology device may obtain a third set of signals from a second calibration target in a scribe line near the device (e.g., as illustrated in FIG. 3C), and validate the signal responses to overlay determined based on the first set of signals using the third set of signals.

In some implementations, the determined overlay error may be sent to a processing tool to adjust further processing of the device. The optical metrology device may obtain a third set of signals from the device, and may determine the signal responses for overlay based on the third set of signals.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of on-device overlay measurement of a device under test, the method comprising:
    obtaining a first set of signals from a plurality of calibration targets, wherein each calibration target has a same pattern as the device under test, each calibration target having a known overlay shift in the pattern;
    determining signal responses to overlay based on the first set of signals;
    obtaining a second set of signals from the device under test; and
    determining an overlay error in the device under test based on the second set of signals and the signal responses.

2. The method of claim 1, further comprising sending the determined overlay error to a processing tool to adjust further processing of the device under test.

3. The method of claim 1, wherein one or more of the plurality of calibration targets has a zero overlay shift.

4. The method of claim 1, wherein obtaining the first set of signals from the plurality of calibration targets comprises obtaining a first signal from a first calibration target and a second signal from a second calibration target, and wherein determining the signal responses comprises:
    determining a difference signal based on the first signal and the second signal; and
    determining the signal responses based on the difference signal.

5. The method of claim 1, wherein one or more calibration targets are in a product area of a wafer with the device under test.

6. The method of claim 1, wherein the known overlay shift comprises overlay shifts in two directions and wherein the plurality of calibration targets comprises two calibration targets for each pattern step on the device under test, wherein the signal responses are determined in both of the two directions.

7. The method of claim 1, wherein the known overlay shift in each calibration target is selected such that a number of calibration targets used in the plurality of calibration targets is one greater than a number of separate overlay errors in the device under test.

8. The method of claim 1, wherein the known overlay shift in the pattern is introduced by a programmed offset in a lithography mask or by adjustment to a lithography tool.

9. The method of claim 1, wherein the plurality of calibration targets is in a scribe line or is on a calibration wafer.

10. The method of claim 1, further comprising:
obtaining a third set of signals from a second calibration target near the device under test; and
validating the signal responses to overlay determined based on the first set of signals using the third set of signals.

11. An optical metrology device configured for on-device overlay measurement of a device under test, the optical metrology device comprising:
a light source that produces light that is incident on and reflected by a sample;
at least one detector that receives the light after it is reflected by the sample;
at least one processor coupled to the at least one detector, wherein the at least one processor is configured to:
obtain a first set of signals from a plurality of calibration targets, wherein each calibration target has a same pattern as the device under test, each calibration target having a known overlay shift in the pattern;
determine signal responses to overlay based on the first set of signals;
obtain a second set of signals from the device under test; and
determine an overlay error in the device under test based on the second set of signals and the signal responses.

12. The optical metrology device of claim 11, wherein one or more of the plurality of calibration targets has a zero overlay shift.

13. The optical metrology device of claim 11, wherein the at least one processor is configured to obtain the first set of signals from the plurality of calibration targets by being configured to obtain a first signal from a first calibration target and a second signal from a second calibration target, and wherein the at least one processor is configured to determine the signal responses by being configured to:
determine a difference signal based on the first signal and the second signal; and
determine the signal responses based on the difference signal.

14. The optical metrology device of claim 11, wherein one or more calibration targets are in a product area of a wafer with the device under test.

15. The optical metrology device of claim 11, wherein the known overlay shift comprises overlay shifts in two directions and wherein the plurality of calibration targets comprises two calibration targets for each pattern step on the device under test, wherein the signal responses are determined in both of the two directions.

16. The optical metrology device of claim 11, wherein the known overlay shift in each calibration target is selected such that a number of calibration targets used in the plurality of calibration targets is one greater than a number of separate overlay errors in the device under test.

17. The optical metrology device of claim 11, wherein the known overlay shift in the pattern is introduced by a programmed offset in a lithography mask or by adjustment to a lithography tool.

18. The optical metrology device of claim 11, wherein the plurality of calibration targets is in a scribe line or is on a calibration wafer.

19. The optical metrology device of claim 11, wherein the at least one processor is further configured to:
obtain a third set of signals from a second calibration target near the device under test; and
validate the signal responses to overlay determined based on the first set of signals using the third set of signals.

20. An optical metrology device configured for on-device overlay measurement of a device under test, the optical metrology device comprising:
a light source that produces light that is incident on and reflected by a sample;
at least one detector that receives the light after it is reflected by the sample;
a means for obtaining a first set of signals from a plurality of calibration targets, wherein each calibration target has a same pattern as the device under test, each calibration target having a known overlay shift in the pattern;
a means for determining signal responses to overlay based on the first set of signals;
a means for obtaining a second set of signals from the device under test; and
a means for determining an overlay error in the device under test based on the second set of signals and the signal responses.

* * * * *